(12) United States Patent  
Hadley et al.

(10) Patent No.: US 8,395,505 B2
(45) Date of Patent: Mar. 12, 2013

(54) SUBSET SELECTION OF RFID TAGS USING LIGHT

(75) Inventors: Mark Alfred Hadley, Newark, CA (US); James Harold Atherton, Morgan Hill, CA (US); Jay Tu, Pleasanton, CA (US); Edward John Boling, Fremont, CA (US); John Stephen Smith, San Jose, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 874 days.

(21) Appl. No.: 12/420,009

(22) Filed: Apr. 7, 2009

(65) Prior Publication Data

US 2012/0249303 A1 Oct. 4, 2012

Related U.S. Application Data

(60) Provisional application No. 61/123,410, filed on Apr. 7, 2008.

(51) Int. Cl.
*G08B 13/14* (2006.01)

(52) U.S. Cl. ............. 340/572.1; 340/10.1; 340/636.2; 340/658

(58) Field of Classification Search .... 340/572.1–572.8, 340/10.1, 10.34, 10.4, 10.5, 10.51, 539.1, 340/539.11, 636.2, 657–668; 363/125, 126; 710/22; 365/145; 235/451; 329/311–314, 329/347, 369; 375/320, 340
See application file for complete search history.

(56) References Cited

U.S. PATENT DOCUMENTS

| | | | |
|---|---|---|---|
| 5,874,724 A | 2/1999 | Cato |
| 5,892,267 A | 4/1999 | Takada |
| 6,175,264 B1 | 1/2001 | Jinbo |
| 6,232,826 B1 | 5/2001 | Afghahi et al. |
| 6,239,651 B1 | 5/2001 | Fournel |
| 6,433,619 B2 | 8/2002 | Akita et al. |
| 6,549,064 B2 | 4/2003 | Bandy et al. |
| 6,734,475 B2 | 5/2004 | Myono et al. |
| 6,734,797 B2 | 5/2004 | Shanks et al. |
| 6,784,813 B2 | 8/2004 | Shanks et al. |
| 6,841,981 B2 | 1/2005 | Smith et al. |

(Continued)

FOREIGN PATENT DOCUMENTS

WO WO 2006/073129 A1 7/2006

OTHER PUBLICATIONS

PCT Notification of Transmittal of the International Search Report and Written Opinion of the International Searching Authority, or the Declaration, for the PCT Int'l. Appln. No. US2009/039826, mailed Sep. 14, 2010, (22 pages).

(Continued)

*Primary Examiner* — Anh V La

(74) *Attorney, Agent, or Firm* — Blakely, Sokoloff, Taylor & Zafman LLP

(57) ABSTRACT

Methods and apparatuses for selecting a subset of RFID tags are provided in some embodiments. These methods and apparatuses utilize the susceptibility to light by persistent nodes found in passive tags. Light can be used to intentionally reduce persistence times in a particular subset tags or even an individual tag. Then, persistent nodes can be used as a selection criterion to distinguish previously illuminated tags from non-illuminated tags. In other embodiments, a power circuit receives a RF input source and generates a direct current (DC) output voltage. The circuit includes a bias circuit to supply a gate to source bias, which is independent of the DC output voltage. The circuit further includes a voltage multiplier circuit that is coupled to the bias circuit. The voltage multiplier circuit has MOS transistors with one transistor to receive the gate to source bias.

20 Claims, 24 Drawing Sheets

U.S. PATENT DOCUMENTS

| | | | |
|---|---|---|---|
| 6,914,528 B2 * | 7/2005 | Pratt et al. | 340/572.1 |
| 7,068,173 B2 | 6/2006 | Shanks et al. | |
| 7,248,165 B2 * | 7/2007 | Collins et al. | 340/572.1 |
| 7,339,485 B2 * | 3/2008 | Ku et al. | 340/636.2 |
| 7,424,265 B2 | 9/2008 | Umeda et al. | |
| 7,501,947 B2 * | 3/2009 | Youn | 340/572.1 |
| 7,920,064 B2 * | 4/2011 | Kang et al. | 340/572.1 |
| 2005/0237843 A1 | 10/2005 | Hyde | |
| 2005/0263591 A1 | 12/2005 | Smith | |
| 2006/0250220 A1 | 11/2006 | Stewart | |
| 2007/0127560 A1 | 6/2007 | Kang et al. | |
| 2007/0257776 A1 | 11/2007 | Kim et al. | |

OTHER PUBLICATIONS

European Search Report, Publication. No. EP 2 420 958 A3, mailed Mar. 5, 2012, (4 pages).

International Preliminary Report on Patentability, for the PCT Int'l. Appln. No. US2009/039826, mailed Oct. 12, 2010, (13 pages).

* cited by examiner

SUBSET SELECTION OF RFID TAGS USING LIGHT

This application is related to co-pending U.S. Provisional Patent Application No. 61/123,410, which was filed on Apr. 7, 2008; this application claims the benefit of the provisional's filing date under 35 U.S.C. §119(e) and is hereby incorporated herein by reference in its entirety.

GOVERNMENT RIGHTS NOTICE

Embodiments of the present invention were made with U.S. Government support under North Dakota State University Subcontract SPP002-5, Defense Microelectronics Activity (DMEA) Contract No. H94003-06-1-0601 (prime). Certain embodiments, including light insensitive circuit structures and transistor based voltage multipliers and demodulators described herein, were made with U.S. Government support under Defense Microelectronics Activity (DMEA) Contract No. H94003-06-1-0612. The U.S. Government has certain rights to this invention.

FIELD OF THE TECHNOLOGY

The present invention generally relates to the field of radio frequency identification ("RFID") devices, and specifically to techniques for subset selection of tags for inventory or testing.

BACKGROUND

RFID labels, inlays, straps, and transponders (commonly referred to herein as "tags") are widely used to associate an object with an identification code. Tags generally combine one or more antennas with an analog and/or digital electronic circuit chip (RFID chip) that may include, for example, communications electronics, data memory and control logic. Examples of RFID tag applications are automobile security-locks, access control to buildings, inventorying and parcel tracking. In general, RFID tags can retain and transmit enough information to uniquely identify individuals, packages, inventory and the like.

There are three basic types of RFID tags. A passive tag is a beam powered device which rectifies energy required for operation from radio waves generated by a reader. For communication, the passive tag creates a change in reflectivity of the field which is reflected to and read by the reader. This is commonly referred to as continuous wave backscattering. A battery-powered semi-passive tag also receives and reflects radio waves from the reader; however a battery powers the tag independent of receiving power from the reader. An active tag, having an independent power supply, includes its own radio frequency source for transmission.

Passive backscatter tags use voltage multipliers to convert RF signals into DC power to power the chips circuitry. The range of a passive RFID tag is limited by its ability to convert low amplitude RF signals into sufficient DC power to power the tag's circuits.

RFID tags can also include sensors, such as vibration sensors, temperature sensors, and light sensors. As an example, a temperature logging RFID tag would periodically sample the temperature of its environment and save the measured temperature to its memory. The reader can later read out this record of temperatures as well as other information from the tag, such as its ID.

The reader, sometimes referred to as an interrogator, includes a transmitter to transmit RF signals to the tag and a receiver to receive tag modulated information. The transmitter and receiver can be combined as a transceiver. Communications between a reader and tag is defined by an air interface protocol, such as (without limitation):

(i) EPCglobal's EPC Radio-Frequency Identity Protocols Class-1 Generation-2 UHF RFID Protocol for Communications at 860 MHz-960 MHz, version 1.1.0 (http://www.epcglobalinc.org/standards/uhfc1g2/uhfc1g2__1__1__0-standard-20071017.pdf) (hereinafter referred to as the "UHF Gen2 standard");

(ii) adaptations of the UHF Gen2 standard for operation at high frequency ("HF"), for example at 13.56 MHz; and (iii) ISO/IEC 18000-6 Information technology—Radio frequency identification for item management—Part 6: Parameters for air interface communications at 860 MHz to 960 MHz, Amendment 1: Extension with Type C and update of Types A and B. Each of the above protocols is incorporated herein by reference for all purposes.

Communication protocols, such as these, may require that a passive tag operate a timing circuit or maintain a flag value during a brief lapse of received power. For example, the UHF Gen2 standard requires persistence for flags SL, S1, S2, and S3, but not S0. U.S. Pat. No. 6,942,155, assigned to Alien Technology Corporation ("Alien," also the assignee to this invention) and incorporated by reference herein for all purposes, provides various teachings on persistent flags and nodes. Other or related techniques have been purportedly suggested by the following patents (each of which is incorporated by reference herein for all purposes):

(i) U.S. Pat. No. 7,259,654; and
(ii) U.S. Pat. No. 7,215,251.

As discovered by Alien, persistent nodes suffer from a latent susceptibility to light, even ambient light. That is to say, exposure to light can dramatically decrease persistent time. During development of the inventions herein, the inventors recorded the results below from conventional tags:

| IC Chip | Persistent Node | UHF Gen2 requirement (seconds) | Measured Persistence Results (seconds) | | |
|---|---|---|---|---|---|
| | | | Dark | Ambient | 40 W Light | Sun Light |
| Vendor A Chip | S1 | 0.5-5.0 | 2.1 | 2.0 | 0.380 | 0.050 |
| | S2 | >2 | 87.0 | 9.0 | 0.070 | <0.02 |
| | S3 | >2 | 77.0 | 7.9 | 0.050 | <0.02 |
| | SL | >2 | 100.0 | 6.3 | 0.040 | <0.02 |
| Vendor B Chip | S1 | 0.5-5.0 | 2.7 | 2.0 | 0.130 | <0.02 |
| | S2 | >2 | 41.3 | 30.0 | 0.990 | 0.370 |
| | S3 | >2 | 33.8 | 30.0 | 1.900 | 0.510 |
| | SL | >2 | 38.8 | 20.0 | 0.800 | 0.320 |

Opaque encapsulation of an integrated circuit chip can reduce this susceptibility, but that may not be desirable or economical.

As an ostensibly unrelated problem, conventional readers generally require complex anti-collision software in order to poll and identify tags when many tags are disposed in its RF field. However, even after identification of each tag, one is unable to respectively associate identification information to each tag. In other words, conventional readers only indicate that a plurality of tags were read, not that a specific tag contained specific data. An individual tag must be physically or electrically isolated (e.g., shielded) to provide desired granularity in information. Readers can bear further complexity by implementing range and bearing techniques as described in U.S. Patent Application Publication No. 2005/0237953 (which is incorporated by reference herein for all purposes), assigned to Alien, to unambiguously associate specific tags to received information.

SUMMARY OF THE DESCRIPTION

Methods and apparatuses for selecting a subset of RFID tags are provided. These methods and apparatuses utilize the susceptibility to light by persistent nodes found in passive tags. Light can be used to intentionally reduce persistence times in a particular subset of tags or even an individual tag. Then, persistent nodes can be used as a selection criterion to distinguish previously illuminated tags from non-illuminated tags.

In one embodiment, a method for selecting a subset of RFID tags comprises setting a persistent node for each of the plurality of passive tags to a first logic value. These persistent nodes are capable of maintaining, under dark lighting conditions, the first logic value in the absence of power for a first time period. Next, power is interrupted to the passive tag for a second time period. The second time period is shorter than the first time period. A subset of the plurality of tags is illuminated with light during at least a portion of the second time period. As a result, the persistent nodes of the subset change into a second logic value before power is resumed. The subset can then be distinguished by the second logic value for identification, testing or other processing.

In another embodiment of the invention an RFID system includes a tag with an integrated circuit. Deep well implants and other techniques are used to make some parts of the integrated circuit insensitive to light.

In another embodiment of the invention an RFID system includes a tag with an integrated circuit. Some parts of the integrated circuit are insensitive to light, but made to vary with temperature. The temperature varying properties of the circuit are used by the reader to calculate the temperature of the RFID tag.

In another embodiment of the present invention, an RFID system includes a tag with an integrated circuit. The integrated circuit maintains during brief absences of power at least one persistent flag. The persistence time of such flag is susceptible to light. The system further includes an RFID reader with an appropriate light source to reduce the persistence time.

In yet another embodiment of the present invention, an RFID reader includes a radio frequency source, an antenna to transmit radio frequency waves generated by the radio frequency source, and a light source. The light source is configured to produce at least one light beam that alters or manipulates a function of an RFID tag. In a specific embodiment, the manipulated function involves a persistent node, persistent flag, or timing circuit.

In yet another embodiment of the present invention, a power circuit receives a RF input source and generates a direct current (DC) output voltage. The circuit includes a first bias circuit to supply a gate to source bias, which is independent of the DC output voltage. The circuit further includes a voltage multiplier circuit that is coupled to the first bias circuit. The voltage multiplier circuit has at least one n-channel metal-oxide-semiconductor (NMOS) transistor or at least one p-channel metal-oxide-semiconductor (PMOS) transistor. The voltage multiplier circuit generates the DC output voltage for powering a RF identification tag in accordance with one embodiment. The first bias circuit receives the RF input source and generates the gate to source bias for a gate terminal of one of the MOS transistors. A second bias circuit receives the RF input source and generates a gate to source bias for a gate terminal of another one of the MOS transistors in the voltage multiplier circuit.

Various additional objects, features, and advantages of the present invention can be more fully appreciated with reference to the detailed description and accompanying drawings that follow.

In yet another embodiment of the present invention, a circuit is made insensitive to light absorbed in the substrate of the chip by isolating the base of transistors in a grounded well. Electron hole pairs which are generated by light in the great majority of the silicon material are then captured by the junction of the well and recombine through the grounded ohmic contacts. The generated photocurrents are thus diverted from sensitive high impedance nodes of the circuit.

In yet another embodiment of the present invention, electron hole pairs which are generated by incident light are then captured by a junction. The photocurrent is then converted into a change of function of the circuits of the RFID tag, and a reader uses information returned by the tag to infer the amount of light incident on the tag.

In yet another embodiment of the present invention, a device in the tag's integrated circuit changes in response to temperature. This change causes a change of function of the circuits of the RFID tag, and a reader uses information returned by the tag to infer the temperature of the tag.

BRIEF DESCRIPTION OF THE DRAWINGS

The present invention is illustrated by way of example and not limitation in the Figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present invention are not necessarily references to the same embodiment; and, such references mean at least one.

Figure 1:
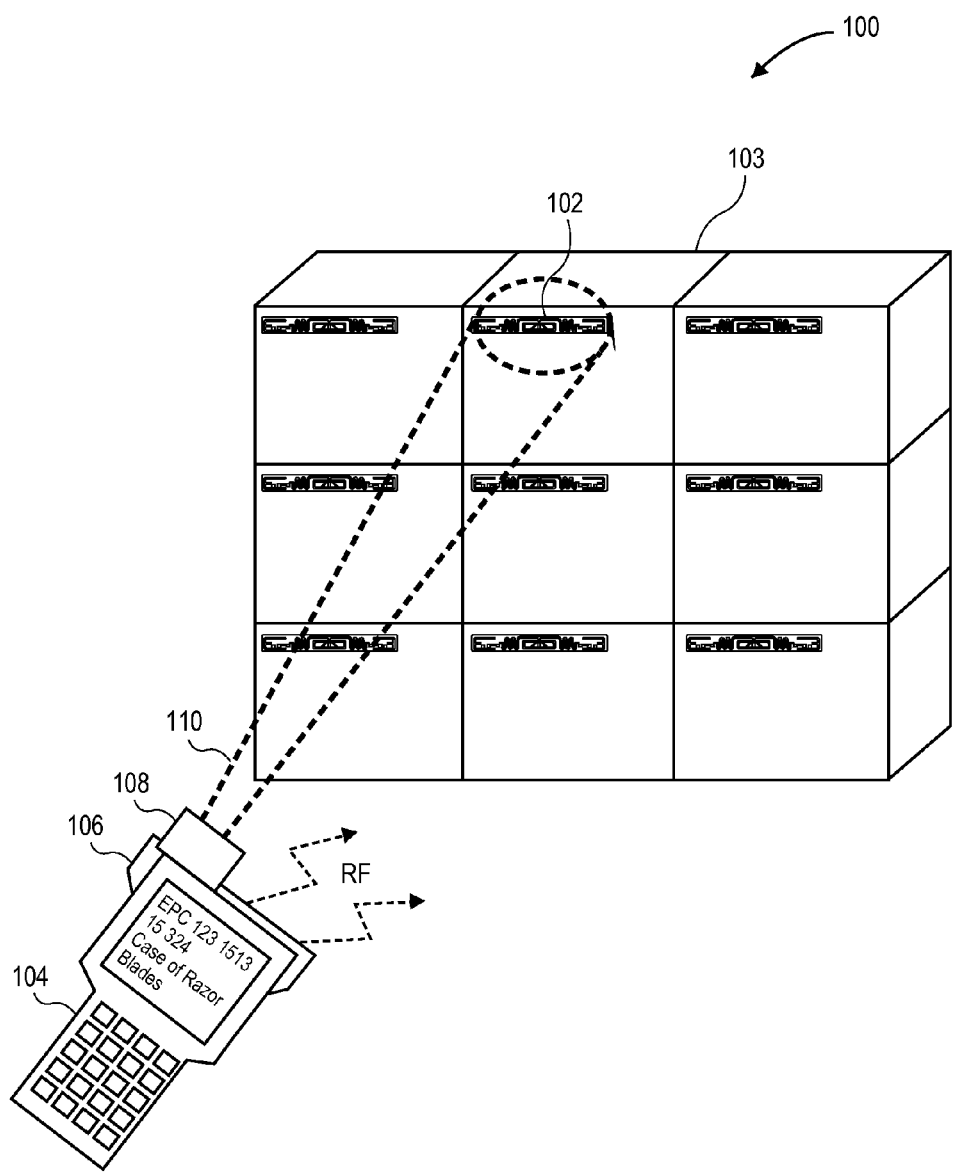
FIG. 1 illustrates a simplified block diagram of an RFID system according to an embodiment of the present invention.

FIG. 1 illustrates a simplified block diagram of an RFID system 100 according to an embodiment of the present invention. In this example, tag 102 is attached to container 103 (e.g., box, corrugated box, carton, or the like). Tag 102 is in close proximity to other tags affixed to similar containers, such as on a densely packed pallet. Due to this proximity, handheld reader 104 using RF antenna 106 observes many tags in its RF field.

In order to singulate tag 102, reader 104 illuminates tag 102 with light beam 110. Light beam 110 can alter the operation of tag 102, thereby distinguishing it from other tags in reader's field. In this embodiment, light beam 110 intentionally hastens the decay of at least one persistent node from a first logic value to a second logic value. Reader 104 can then selectively communicate with tag 102 using the second logic value as a selection criterion.

Light beam 110 can encompass any portion of the entire electromagnetic spectrum, including ultraviolet (about 10 nm to 400 nm wavelength), visible (about 400 nm to 700 nm wavelength), infrared (about 700 nm and 1 mm wavelength) radiation, or combination thereof. In a preferred embodiment, light beam 110 includes infrared radiation since conventional persistent nodes are particularly susceptible to such radiation. The intensity of the light is at least 500 watt/m$^2$, or more than at least 100 watt/m$^2$, or even more than at least 10 watt/m$^2$. The intensity of light beam 110 influences the speed of decay in persistence time. Increasing light intensity shortens persistence time—this correlation need not be linear.

In FIG. 1, light source 108 is integrated with, or attached to, reader 104. In alternative embodiments, light source 108 can be disposed away from the reader and electrically coupled to the reader or commonly controlled by a host computer. Preferably, light source 108 includes a manual or automatic adjustable aperture to vary beam size. With a wide aperture, light beam 110 encompasses a subset of tags, while a narrow aperture singulates an individual tag. In a specific embodiment, light source 108 can be a light projector illuminating a plurality of tags in a pattern. The pattern can be (i) a predetermined pattern (e.g., checkerboard, diagonal, crisscross, polygon, oval, rectangle, donut shaped with a lighted ring portion and an unlighted central portion etc.), (ii) a pseudo-randomly generated pattern, or (iii) a sequence or combination of either (i) and/or (ii).

Light source 108 can use any type of source, including without limitation:

(i) combustion light (e.g., argon flash, acetylene/carbide lamps, candles, fire, gas lighting, kerosene lamps, and lanterns);

(ii) direct chemical light (e.g., chemoluminescence (lightsticks), fluorescence, and phosphorescence);

(iii) electric light (arc lamps, incandescent lamps, flashlight, halogen lamps, electroluminescent lamps, light-emitting diodes ("LED") (organic light-emitting diodes, polymer light-emitting diodes, solid-state lighting), gas discharge lamps, fluorescent lamps, neon and argon lamps, plasma lamps, xenon flash lamps, and high-intensity discharge lamps); or (iv) reflections of the above.

In fact, natural light (e.g., astronomical objects, solar radiation, skylight, sunlight, moonlight, or bioluminescence) can be used in lieu of, or in addition to, light source 108. In a preferred embodiment, light source 108 is at least one of an LED, fluorescent bulb, and incandescent bulb. In a more preferred embodiment, a spectrum of the light source 108 includes wavelengths that will be absorbed by silicon to create electron hole pairs as described in more detail below with the light insensitive circuit structures, such as an infrared LED.

System 100 provides many benefits in package handling, warehouse and retail environments. A user may need to determine the contents of a particular package, and not others in its proximity. For example, in FIG. 1, the user may solely want to determine the contents of container 103. She can easily do so under system 100 by illuminating tag 102. However, with conventional RFID systems, she would need to identify all the containers within a reader's RF field and still not necessarily know which specific container held a desired item.

For further utility, reader 104 can employ range and bearing techniques in conjunction with light source 108 to visually indicate a desired container 103. Reader 104 can initially illuminate the location indicated by range and bearing. As confirmation, reader 104 can next verify that a persistent time associated with tag 102 has decreased after illumination. If a persistence time for tag 102 is not reduced, reader 104 can automatically re-direct light beam 110 to adjoining areas until tag 102 is confirmed to be illuminated by a decreased persistent time. Alternatively, light source 108 can illuminate a large area and then systematically decrease the area size until reader 104 determines that only tag 102 has reduced persistence, thus indicating that tag 102 is the only tag within the light beam.

It should be clear from the teachings herein that a persistent flag is a bit, character(s), or other indicator that signals the occurrence of some condition. The persistent node is a circuit which is initialized to a value, and the value read from the persistent node can change at some later time. Persistent flags can be implemented using persistent nodes as described in one or more of the incorporated references. As an example, persistent flags can be implemented essentially as a timer using persistent nodes. For example in the ISO/IEC 18000-6c specification, each flag has one of two values. "A" or "B" for the S1, S2 or S3 flags, and "asserted" or "deasserted" for the SL flag. They can operate by charging a capacitor up to a certain level and then discharging that capacitor over time. When the capacitor has a charge above a threshold level, it represents "B"; when the charge drops below that threshold level, it represents "A". Thus, when the RF signal is turned off, if the capacitor charge is already below the threshold signifying "A". any charge simply dissipates over time. Similarly, if the capacitor charge was above the threshold, signifying "B" when the RF signal is turned off, the charge dissipates over time until the capacitor is discharged or the RF power is turned back on. In both cases of this example, a transistor coupled to the capacitor controls the rate of discharge such that a "B" value would remain for the required persistence time. In other words, the transistor acts as a clamp to cut off the capacitor from the rest of the circuitry so as to allow a slow rate of discharge. Once the capacitor charge goes below the threshold level required for a "B", the value will become "A".

Figure 2:
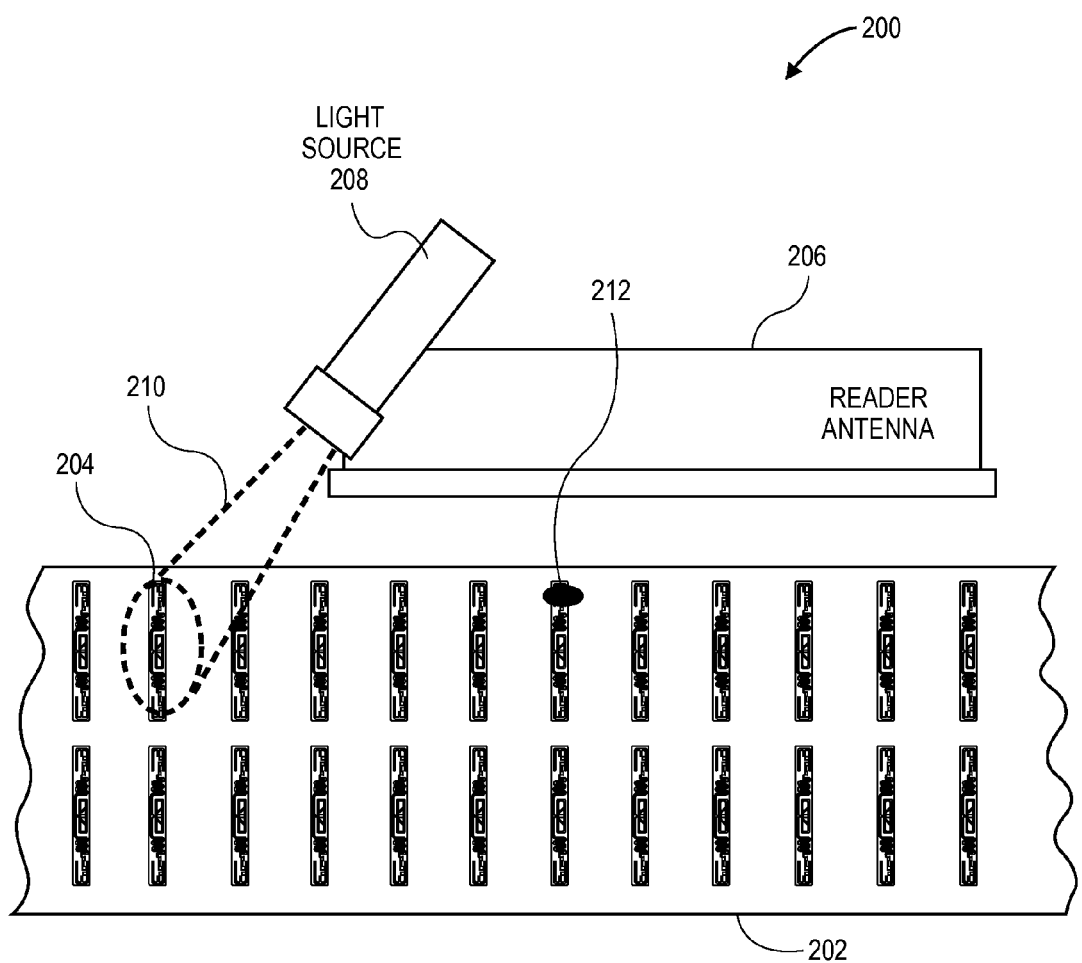
FIG. 2 illustrates a simplified example of an RFID system according to another embodiment of the present invention.

FIG. 2 illustrates a simplified example of RFID system 200 according to another embodiment of the present invention. Substrate 202 includes a plurality of inlays assemblies, including inlay assembly 204. In a specific embodiment, inlay assembly 204 comprises a strap: a surface mounted IC chip, strap contact pads electrically coupled to the IC chip, and the underlying portion of strap substrate. The surface mounted IC, or flip chip, can be robotically placed on strap substrate. In another embodiment, a strap assembly comprises an IC chip embedded in substrate, a portion of a dielectric layer overlying the strap substrate, and strap contact pads on the dielectric layer. The embedded IC chip can be deposited robotically (such as by "pick-and-place" methods) or by fluidic self-assembly methods, as described in U.S. Pat. Nos. 5,545,291 and 7,260,882 (which are incorporated by reference herein for all purposes). Pick-and-place techniques can be used to directly place a surface mounted IC on substrate 202 to form inlays without the use of strap assemblies.

In a specific embodiment, reader antenna 206 is both reader and reader antenna, such as an ALR-9650 offered by Alien. The ALR-9650 is a smart antenna, the reader electronics and a circularly polarized antenna reside in a single package. Equally, a smart antenna can use a linearly polarized antenna in lieu of a circularly polarized antenna. However, for many applications, the reader will be disposed away from its reader antenna(s) (e.g., one, two, three, four or more antennas). It should be noted that in embodiments where only one antenna is shown herein, alternative embodiments can include multiple antennas coupled to a single reader to achieve greater diversity in signal orientation and coverage.

Each inlay assembly is interrogated via reader antenna 206. For strap assembly testing, light source 208 singulates each strap assembly by modifying a persistent node. The singulated strap assembly and reader can then exclusively communicate, allowing the reader to test the performance of the specific strap assembly.

This test method eliminates the need for physical or electrical isolation (e.g., shielding) of individual inlay assemblies under test. A resonant cavity, as used in U.S. patent application Ser. No. 11/809,610, which is incorporated by reference herein for all purposes) to receive a single response at the exclusion of others, is unnecessary. The reader need not worry about interfering responses from adjacent inlay assemblies, since their persistent nodes would not satisfy the selection criteria. Light source 208 can then reposition its light beam 210 to another strap assembly and repeat the process until all inlay assemblies on substrate 202 are tested. Inlay assemblies failing the performance test can be marked by a laser or ink marker (not shown in FIG. 2) with rejection mark 212 or by entering a pass code in the tag's memory. This test method can also be applied to RFID straps and labels.

Substrate 202 can be a sheet, web (for example, an unwound roll in a roll-to-roll process), tape, reel, or the like. If substrate 202 is intermittently or continuously in motion relative to light source 208, then light source 208 can account for such motion in directing light beam 210 at its targeted strap assembly. For fast moving substrates, such as typically found in RFID roll-to-roll processing, two separate readers or reader antennas with a light source between them may be needed. The first reader energizes the inlays and sets at least one persistent node to a first logic level for all strap assemblies. The intervening light source illuminates a subset of strap assemblies (e.g., one, two, three or more strap assemblies) to alter the persistent node. The second reader can then selectively communicate with the subset based on the logical value of the persistent nodes. If more than one inlay assembly is illuminated, the reader may need to incorporate anti-collision algorithms for effective communication, such as implemented for conventional EPC compliant tags.

Figure 3:
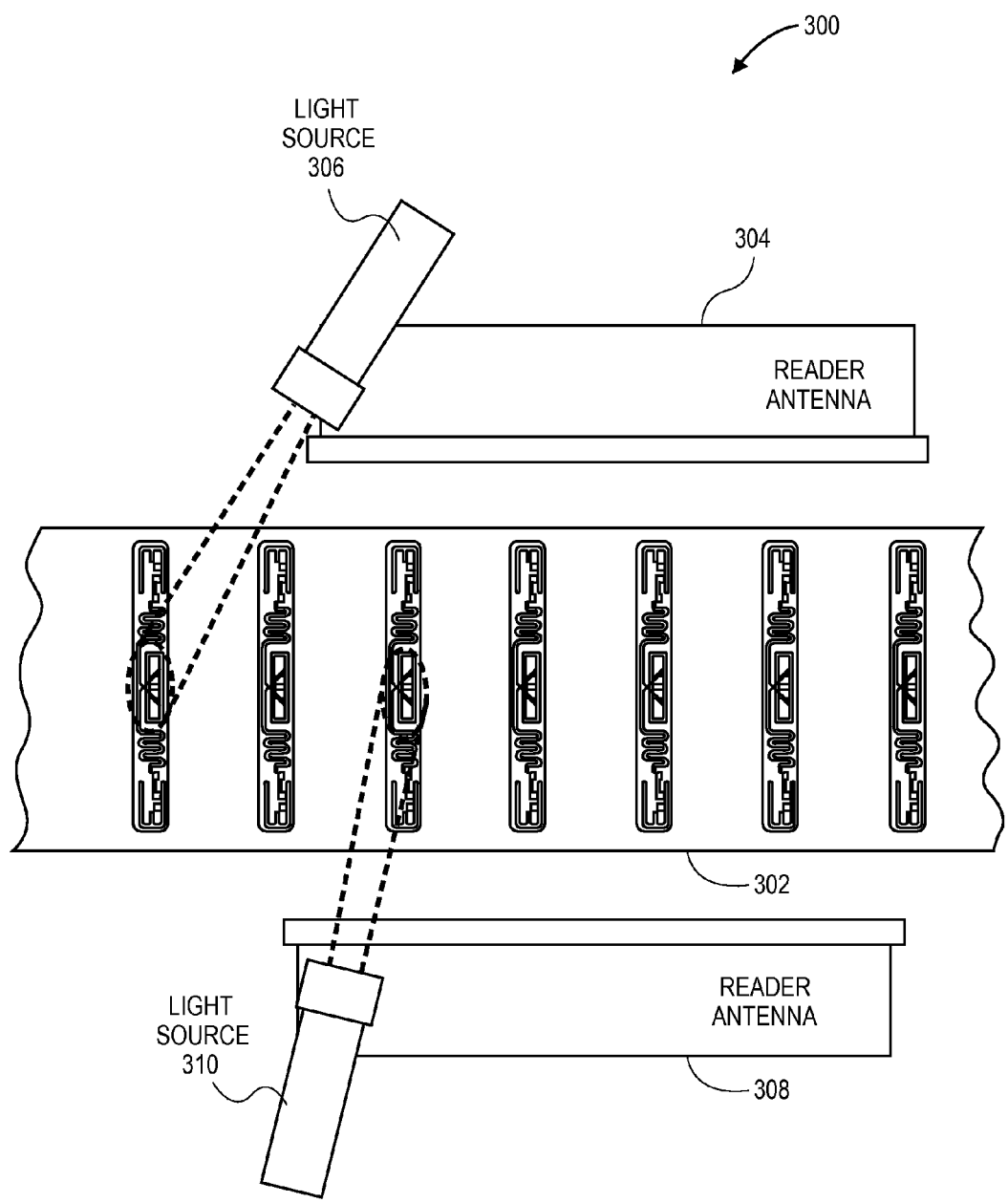
FIG. 3 illustrates a simplified example of an RFID system according to yet another embodiment of the present invention.

FIG. 3 illustrates a simplified example of RFID system 300 according to an embodiment of the present invention. RFID system 300 includes at least two readers. A first reader uses antenna 304 and light source 306 to singulate, identify, and/or test inlay assemblies on substrate 302. Similarly, a second reader uses antenna 308 and light source 310 to singulate, identify, and/or test inlay assemblies. By providing two readers, the throughput of system 300 can be doubled. Both the first and second readers can be controlled by the same host computer. To reduce contentions between the two readers, each can be assigned to use its own inventory session. For example, under the UHF Gen2 standard, tags have four session flags, S0, S1, S2, and S3. Reader 1 can be dedicated to use the S2 flag, while Reader 2 can be dedicated to use the S3 flag. Both S2 and S3 flags are persistent.

Figure 4:
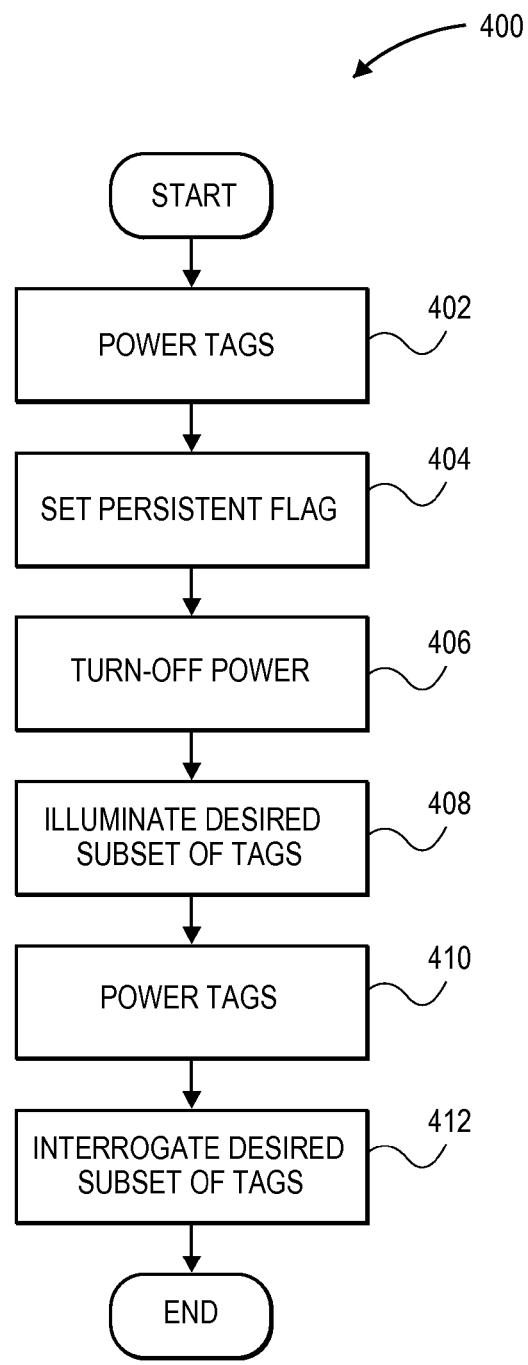
FIG. 4 illustrates a simplified flowchart for subset selection according to an embodiment of the present invention.

FIG. 4 illustrates a simplified flowchart 400 for subset selection according to an embodiment of the present invention. In step 402, a reader transmits a continuous wave RF (radiofrequency) signal ("CW") to provide power to passive tags within the reader's field. The CW can be a broad beam signal encompassing a wide area. Next, in step 404, at least one persistent flag is set. This can be accomplished by the reader issuing a SELECT command requiring all tags to assert the SL flag or other persistent flag (e.g., set one of S1, S2 or S3 flags to "B" logic value) after being inventoried. The reader then inventories all tags to ensure each tag sets the designated persistent flag.

In step 406, the reader ceases transmissions for an off time. In one embodiment, step 406 can be accomplished by frequency hopping in accordance with 47 CFR Part 15, and more particularly subpart C. During at least a portion of the off time, a desired subset of tags is illuminated in step 408. The illumination with light can be narrowly focused, or a narrow beam in comparison to the CW RF signal. For example, tags can be illuminated for a fixed period of time, e.g., range of about 0.01 to about 0.5 seconds. The subset can include any number of tags, for example, one, two, three or more tags. In one embodiment, the subset of illuminated tags is a proper subset of tags within the reader's RF field. That is to say, the illuminated tags are a subset of the tags within the reader's RF field, but the illuminated tags do not include all such tags.

The duration and intensity of illumination should allow a persistent flag to change value (for example, (i) SL to ~SL or (ii) "B" value to "A" value for a session flag) before the completion of the off time. In step 410, the reader resumes transmission of a continuous RF wave to power tags. The off time should be less than the minimum specified persistent time (or alternatively, the minimum expected persistent time for the particular tags) under non-illuminated conditions to ensure that the persistent flag correctly distinguishes the desired subset from other tags.

The reader can now interrogate the desired subset in step 412. For example, using the ISO/IEC 18000-6c protocol, the reader can issue QUERY commands indicating the persistent flag value as the criteria for participating in an inventory round. For instances, the QUERY command can specify deasserted SL flags (~SL) in its "Sel" field, or S2 flags with an "A" value. Accordingly, only tags matching the specified criteria will respond to the reader in that inventory round.

Figure 5:
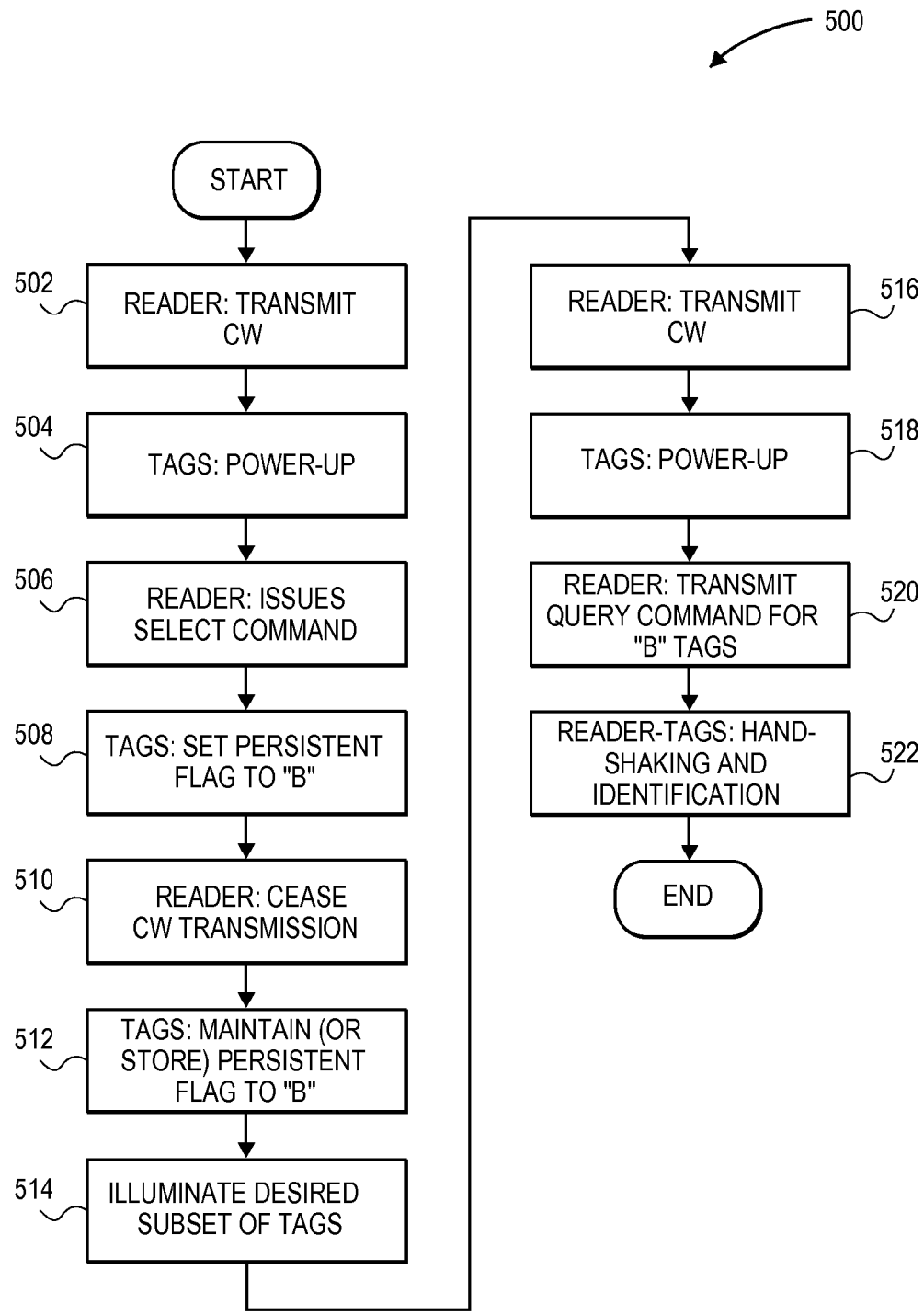
FIG. 5 illustrates a simplified flowchart for subset selection according to another embodiment of the present invention.

FIG. 5 illustrates a simplified flowchart 500 for subset selection according to another embodiment of the present invention. Flowchart 500 includes several common elements to flowchart 400. Thus, given an understanding of the present invention from the detailed description above, flowchart 500 needs no further explanation.

Susceptibility to light can inexpensively enable another function for an RFID tag—light sensor. Susceptibility of persistent nodes or other tag function can be used as a light sensor to detect the presence of light, intensity of light, and/or the duration of illumination. By way of example, a reader can iteratively determine (by repetitive step decreases or increases in off times) the persistent time for one or more tags. If a persistent time is less than a nominal time or some minimum time, the reader can infer or determine the presence and intensity of light exposure on the tag. The reader can establish the approximate time of day based on persistence timing (preferably, from results of a plurality of tags to provide superior accuracy).

As discussed above, Alien has devised circuitry to make persistent nodes substantially immune to light. However, in order to achieve the benefits described herein, a tag manufacturer can elect to keep certain persistent nodes susceptible and not others. For example, the persistent S2 and S3 flags under the UHF Gen2 standard can be made immune, while keeping the SL flag susceptible. In such case, embodiments of the invention described herein that use the persistent S2 or S3 flags can instead make use of the SL flag. In certain embodiments, an RFID tag can be constructed, using either shielding or circuitry, so that some persistent node or nodes are sensitive to light radiation and other persistent node (or nodes) are not sensitive to light radiation (or they are much less sensitive to light radiation). Such an RFID tag may be constructed using an embodiment of the light insensitive circuitry described below.

The inventions have been generally described in detail for a subset selection, but these inventions can be applied to other tag functions. For example, a persistent node can control write access to a tag's memory, thereby only illuminated tags can be written to with new information. As another example, persistent nodes can control an operational state of a tag— illumination of the tags causing the tag's state machine to move from a first operating state to a second operating state. These operating states can be a READY state, SLEEP state, ACKNOWLEDGED state, OPEN state, SECURED state, LOCKED state, REPLY state, or the like. For tags implementing tiered identification protocol, such as described in U.S. Provisional Patent Application 60/904,590, which is incorporated herein for all purposes), illuminated tags can respond with a first identifier, while non-illuminated tags can respond with a second identifier. Light intensity can be used to affect a tag identification number (TID) of illuminated tags, including making the TID available or unavailable for reading and/or writing.

Additionally, the techniques described herein can be applied for the following:

varying the intensity of light to develop range information;
light sources spaced at positions away from the reader to define zones of interest or non-interest;
light sources used in a printer to do isolation allowing a cheaper programming head;
a varying light beam size coordinated with a positioning algorithm;
different and unique persistent nodes optimized for a particular wavelength for further isolation;
sweeping a light curtain in one two or three dimensions to help coordinate position;
using the same or a different light source to identify a particular tag one isolated; or
using the same light source that a barcode reader uses to read bar codes.

Light Insensitive Circuit Structures

Very low current circuits can undergo undesirable parametric shifts when exposed to light, or more generally, electromagnetic radiation. It is not always possible or economical to externally shield affected circuits. This disclosure pertains to integrated circuit structures capable of reducing electromagnetic sensitivity of critical circuit parameters (e.g., analog data persistence time, time base oscillation frequency, reference current magnitude, and other critical performance parameters and functions).

Sufficiently energetic photons, upon entering a semiconductor, will create electron-hole pairs. Wavelength of these photons may be in the x-ray, ultraviolet, visible, or infrared portions of the electromagnetic spectrum. Whether a particular wavelength poses circuit performance problems depends on the constitution, design, and packaging of the semiconductor circuit. For the case of low-cost RFID, we are particularly concerned about near-infrared radiation (700 nm to 1300 nm) in silicon circuitry, and specifically CMOS circuitry. It should be recognized; however, that other semiconductors and component types might be sensitive to different wavelength ranges. It is possible to block incident radiation by the use of light shielding materials such a metal, thick paper or plastic, or pigments or dyes, but such light blocking materials or layers add undesirable cost or bulk to the RFID tag.

Focusing now on photo generated electron-hole pairs in silicon, these excess charge carriers diffuse throughout the silicon bulk until they recombine, or are separated by the electric field associated with a pn junction. Carrier separation results in charge flow (current) that can perturb operation of low current circuits (nanoamps to picoamps).

Figure 6:
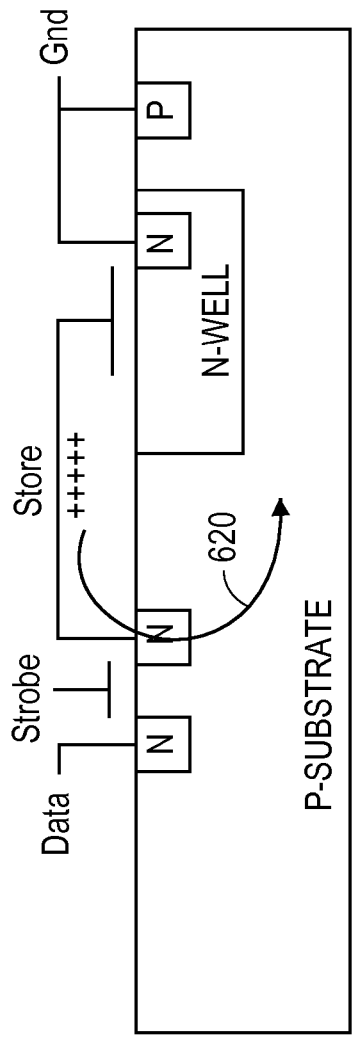
FIG. 6 illustrates a schematic and cross sectional view of a circuit with an analog storage device in accordance with one embodiment of the present invention.
Figure 6:
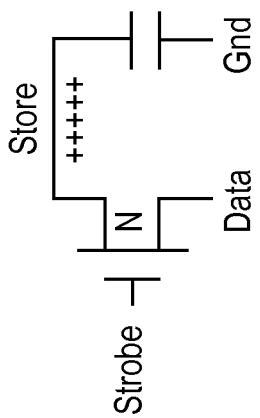

FIG. 6 illustrates a schematic and cross sectional view of a circuit with an analog storage device in accordance with one embodiment of the present invention. Analog storage occurs in the following manner. The n-channel access transistor is turned on by driving Strobe to an appropriately high, positive potential. Analog data is passed as a voltage from Data to Store. Strobe is then driven low, trapping charge on the storage capacitor. This charge represents the analog voltage to be "remembered". Perturbation of trapped charge results when photo generated electron-hole pairs are separated by the junction formed between p-substrate and n-channel drain. A curved arrow 620 denotes charge flow through this junction. The photo induced current removes trapped charge, changing the value of "remembered" voltage.

Figure 7:
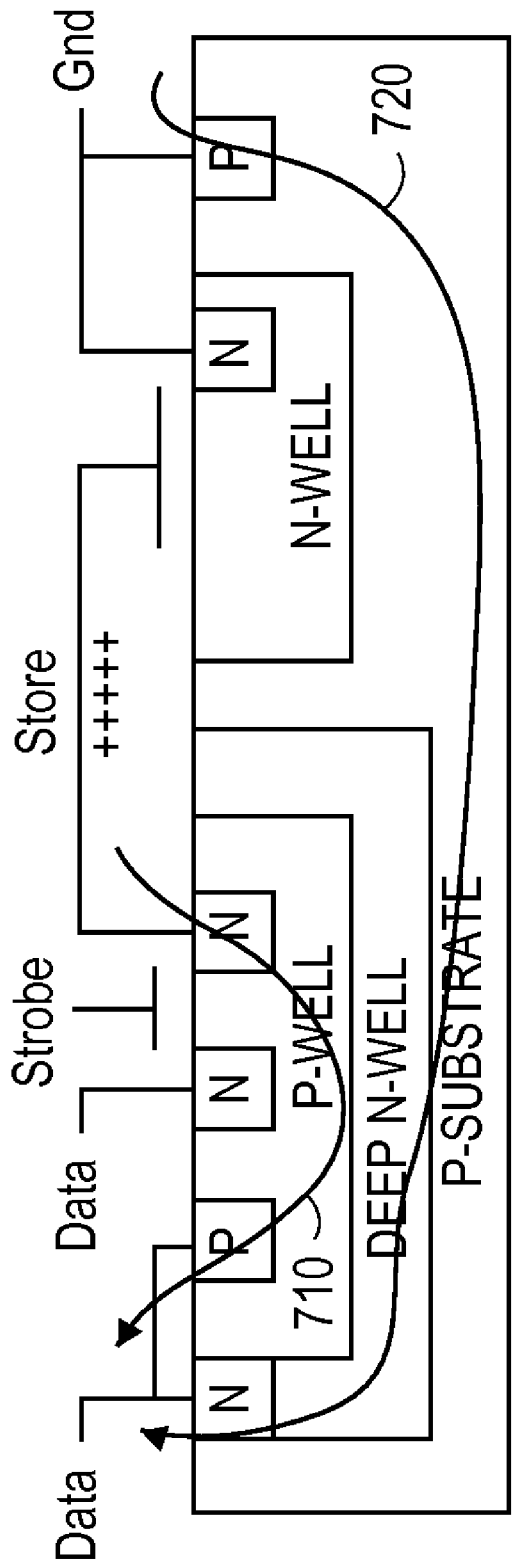
FIG. 7 illustrates a cross sectional view of a circuit structure having an n channel transistor in accordance with one embodiment of the present invention.

In one embodiment, the disclosed invention significantly reduces photocurrent by preventing excess charge carriers from reaching any critical junction. FIG. 7 illustrates a cross sectional view of a circuit structure having an n-channel transistor in accordance with one embodiment of the present invention. A deep n-well is constructed to totally enclose the critical drain junction. Electron-hole pairs generated within p-well can still contribute to photocurrent discharge of Store as illustrated with arrow 710, but since the volume of p-well is quite small relative to volume of p-substrate, effective harmful photocurrent will be minimal. Electron-hole pairs generated within p-substrate and deep n-well are rendered harmless in that any resulting current exists in a ground loop 720.

The deep n-well implements a backside protection by controlling movement of excess charge carriers present in the silicon substrate. Care should be taken to minimize photons directly entering p-well as no protection is afforded against electron-hole pairs created in this region. A practical step is to arrange topside metal layers in a manner that prevents light from entering p-well. In this way the metal layers combined with the deep n-well create a protective box around critical junctions.

It may appear that including deep n-well necessitates a semiconductor process modification. This is not necessarily the case. Many process technologies make possible an isolated p-well through incorporation of a deep n-well implant and judicious use of n-well.

Figure 8:
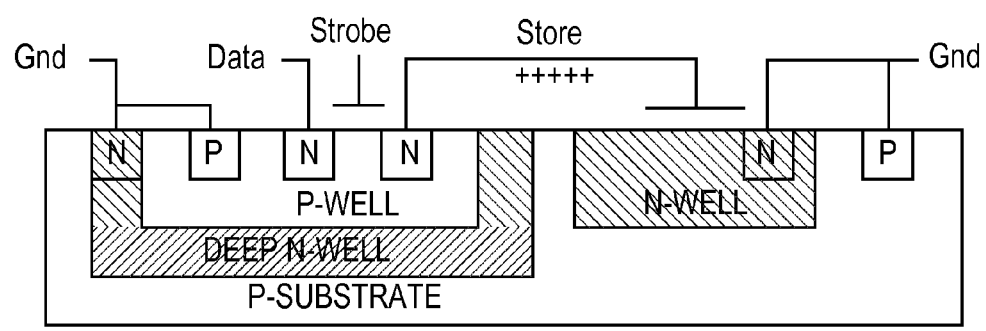
FIG. 8 illustrates a cross sectional view of a circuit structure having an isolated p-well in accordance with one embodiment of the present invention.

FIG. 8 illustrates a cross sectional view of a circuit structure having an isolated p-well in accordance with one embodiment of the present invention. A deep n-well is an implant peaked far below the silicon surface and appears as a buried layer. Electrical connection is made via the normal n-well.

The circuit of FIG. 6 has specific application in RFID chips for implementing "persistent nodes". Such nodes keep a temporary record of chip state in an environment where brief power interruptions are a common occurrence. A key requirement is that change of the stored analog voltage not be too great over a time interval of seconds, independent of supply voltage. Clearly, uncontrolled photocurrents could result in rapid capacitor discharge. The disclosed invention provides a means for achieving proper persistent node operation in bright sunlight conditions, or in other situations where strong sources of infrared, visible, ultraviolet, or x-ray radiation are present.

In some embodiments, referring to FIG. 8, the specific electrode connections allow switch like behavior of the n-channel transistor. It is permissible to disconnect deep n-well and p-well from Gnd and reconnect to Data. In this case, the MOS transistor exhibits a reduced threshold voltage and functions in parallel with a parasitic, diode connected, NPN transistor. This scheme is advantageous in low voltage operation of the analog storage device, specifically for persistent node realization. The advantage derives from the fact that Strobe potential required for passing data is lowered. A price to be paid is that Data must be driven low when Strobe goes low in order that the NPN transistor be turned off. In any event, the modified circuit remains photocurrent insensitive regardless of power supply behavior.

Other variations can be envisioned if focus is shifted from analog storage and trained solely on n-channel transistor function. Again referring to FIG. 8, deep n-well can be disconnected from Gnd and reconnected to the most positive supply. The p-well can be connected to Data. Grounding Data results in a common source configuration with little photocurrent mingling with drain (Store) output current. Treating Data as an output while connecting Store to the most positive supply creates a source follower configuration in which little photocurrent combines with source (Data) output current.

Figure 9:
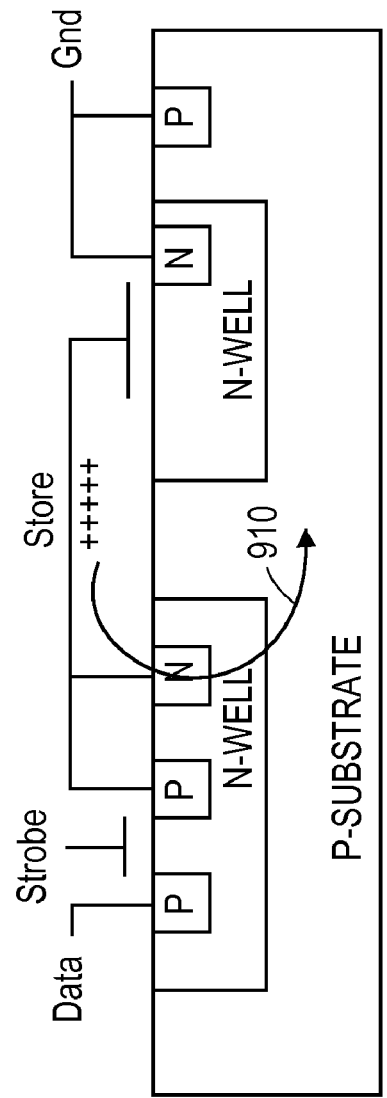
FIG. 9 illustrates a schematic and cross sectional view of a p-channel circuit for Analog Data Storage in accordance with one embodiment of the present invention.
Figure 9:
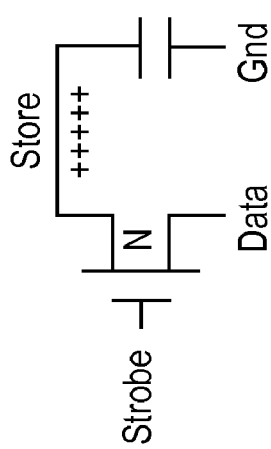

FIG. 9 illustrates a schematic and cross sectional view of a p-channel circuit for Analog Data Storage in accordance with one embodiment of the present invention. FIG. 9 returns to the example of an analog storage device but this time the access transistor is p-channel. In one embodiment, p-channel transistors can also benefit from the disclosed invention although differences in details exist. Circuit operation is as follows. The p-channel transistor is turned on by driving Strobe to an appropriately low potential. Analog data is passed as a voltage from Data to Store. Strobe is then driven high, trapping charge on the storage capacitor. Perturbation of trapped charge results when photo generated electron-hole pairs are separated, predominantly by the junction formed between p-substrate and n-well. A curved arrow 910 denotes charge flow through this junction. The photo induced current removes trapped charge, changing the value of "remembered" voltage.

Figure 10:
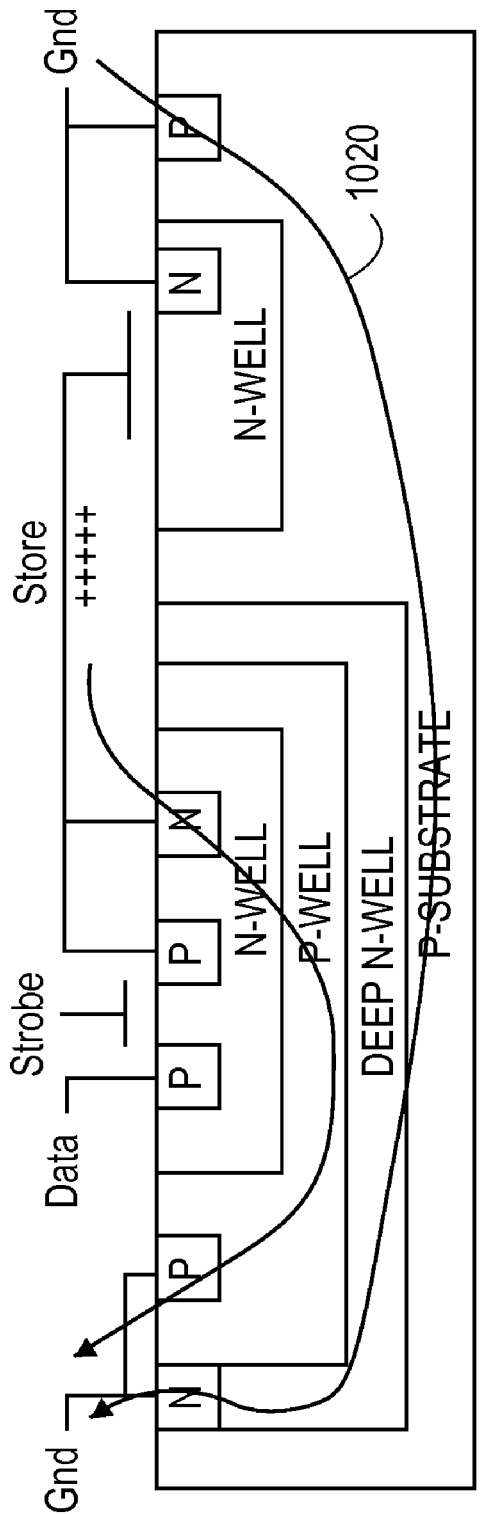
FIG. 10 illustrates a cross sectional view of a circuit structure having a PMOS transistor in accordance with one embodiment of the present invention.

FIG. 10 illustrates a cross sectional view of a circuit structure with an PMOS transistor in accordance with one embodiment. A deep n-well completely encloses the critical n-well/p-well junction. P-well volume is favorably smaller than p-substrate volume leading to greatly reduced photocurrent. As in the n-channel case, deep n-well acts to control movement of photo induced excess charge carriers, forcing these carriers to become part of a ground loop current 1020. Also, various alternate electrode connections can be envisioned that preserve the invention's advantage of photo insensitivity. These alternate connections may be applied to the analog storage device or to general operation of a p-channel transistor.

Two significant departures exist relative to the previously explained n-channel implementation. Isolated p-well cannot be achieved in the same, simple manner. The reason is deep n-well must now occur below normal n-well, which is an integral part of a p-channel transistor. A modified, non-standard, process technology is necessitated. The modifications are not substantial, but are nonetheless, modifications. Clearly, the requisite technology accommodating p-channel transistors would also suffice for their n-channel counterparts (compare FIGS. 7 & 10).

The second departure stems from the fact that a p-channel transistor is afforded natural immunity to photocurrents under specific bias conditions. Looking back at FIG. 9, if a positive power supply is available, then n-well can be disconnected from Store and reconnected to positive supply. Most photocurrent will now be shunted away from Store in the direction of positive supply. A small photocurrent will continue to affect trapped charge on Store. Magnitude of this current will be greatly reduced because the volume of n-well is so much less than volume of p-substrate. This arrangement works well for a wide variety of circuits and does away with the necessity of deep n-well as a means to reduce photo sensitivity. Unfortunately, the persistent node application in RFID chips is an example where no convenient, reliable supply is available.

All of the foregoing is quite general with regard to reducing photo sensitivity of CMOS transistors and is extendable to a wide variety of CMOS circuits. As an example of this generality, consider the current biased oscillator of FIG. 11 in accordance with one embodiment. Transistors P1, P2, N1, and N2 in concert with resistor R establish a bias current I.

This current is mirrored in devices P3, P4, and P5. Vout is an oscillating voltage with frequency inversely proportional to the value of I. Photo insensitive oscillation occurs when drain currents for all transistors are relatively insensitive to illumination. Of course, this can be achieved by running an arbitrarily high bias current. Alternatively, bias current can be kept advantageously low and photocurrents managed in accord with the disclosed invention. Specific operations to be taken are:

Place all p-channel devices in a common n-well keeping n-well area as small as possible. Connect n-well to Vdd. No deep n-well is required, as the normal n-well will shunt majority of photocurrent to Vdd. Use top-level metal layers to block light from n-well. This is particularly critical in the vicinity of any p-channel drain to n-well junction. It is preferable to completely shield n-well.

Place all n-channel devices in a common, isolated p-well keeping p-well area as small as practical. Connect p-well to Gnd. A deep n-well connected to Gnd is necessary to act as shunt for photocurrents. Use top level metal layers to block light from p-well. This is particularly critical in the vicinity of any n-channel drain to p-well junction. It is preferable to completely shield isolated p-well.

Figure 11:
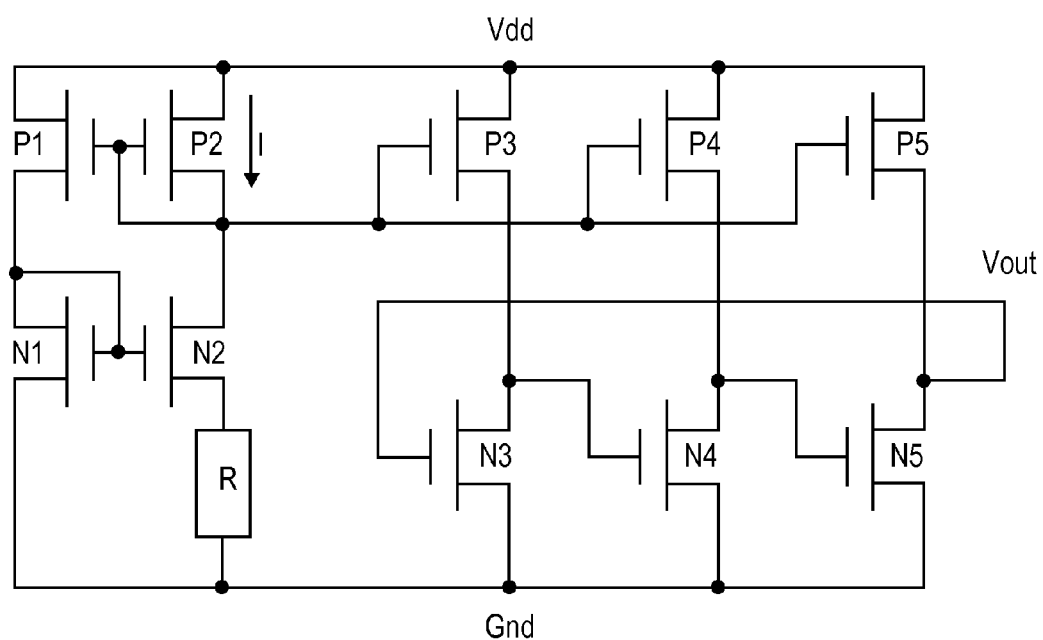
FIG. 11 illustrates a circuit of a current biased oscillator in accordance with one embodiment of the present invention.

In some embodiments, the light insensitive circuit structures described herein provide the following:
1. Circuit structure in which isolated p-well is used to reduce photocurrent present in terminal currents of CMOS transistors (FIG. 10).
2. Circuit structure in which isolated p-well is used to reduce photocurrent present in terminal currents of n-channel transistors and where p-well construction is consistent with commonly available semiconductor process technology (FIG. 8).
3. Specific application of persistent nodes in RFID chips
   N-channel version (FIG. 7)
   P-channel version (FIG. 10)
   CMOS version (FIGS. 7 & 10 combined)
4. General application of low current circuits in RFID system (FIG. 11).

In other embodiments, additional ways to enhance light insensitivity include the inclusion of backside metallization (backside of chip), the creation of traps and/or recombination sites in a substrate material, and/or the creation of a dielectric layer within the substrate material, removal of the substrate, or using an insulating substrate.

Transistor Based Voltage Multipliers and Demodulators

In some embodiments, MOS transistor devices are used as rectifying elements in voltage multipliers and demodulators. A special bias circuit reduces the effective threshold of the rectifying elements, allowing the use of normal threshold transistors.

Voltage multipliers that are powered by AC input voltages find applications in many areas. The basic building block of such a circuit is usually a voltage doubler circuit containing two rectifying elements and producing a DC output voltage. A multiple of such circuits can be arranged with the AC input voltages in parallel and the DC output voltages in series to produce a multiple of the dc voltage for a given AC input voltage. This arrangement forms the voltage multiplier. In theory, an arbitrarily high total DC voltage can be produced depending on the number of stages.

The rectifying elements that make up the doubler circuit can be one of a number of devices. In most instances, doubler performance is enhanced by a lower turn-on threshold of the rectifying element, especially at low AC input voltages. Diodes and diode-connected transistors are the most common element used in integrated circuit implementations. For high speed operation at about 1 GHz and beyond, Schottky diodes are often used. These diodes are fast due to the conduction mechanism, and have a much smaller threshold voltage for forward conduction. However, optimized Schottky diodes are not always available in semiconductor processes, and may require additional processes and masking steps. The diode-connected MOS transistor device is available as a standard part of processes, but in an unmodified form usually has a higher threshold voltage than a Schottky diode.

In certain embodiments of the present invention, standard high-threshold MOS devices are used to implement a high performance voltage multiplier or doubler circuit, without the use of any special processes or device. Doubler and voltage multiplier circuits have been constructed and tested which out-perform Schottky diodes at 915 MHz. A special version of the circuit has also been designed for applications where a more linear response to the input AC voltage is required, such as demodulators. The application in which the circuit was tested was a Radio Frequency Identification device, or RFID.

The basis of the circuit is the use of a very low power circuit to generate a bias voltage. This bias voltage is used to effectively reduce the threshold voltage of a MOS transistor. This device then behaves in a manner similar to a low-threshold diode connected transistor. The result is a high performance doubler or multiplier circuit using standard CMOS processing.

Figure 12:
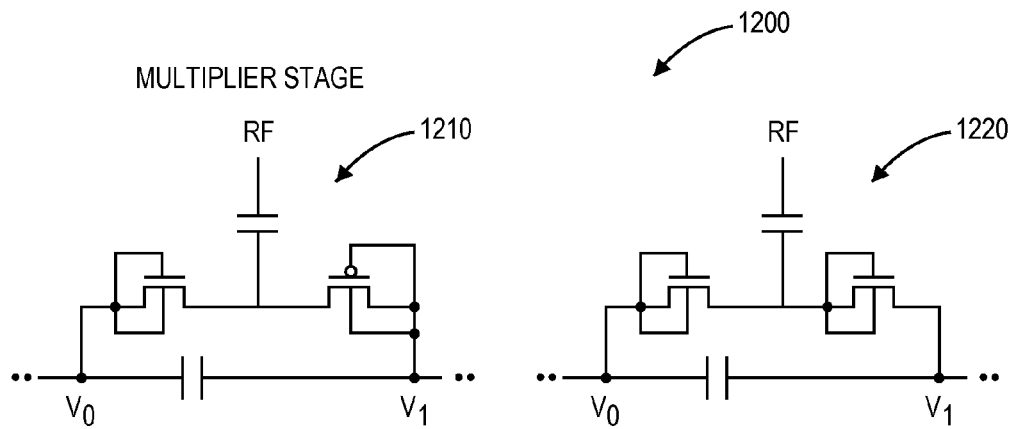
FIG. 12 illustrates a conventional CMOS transistor doubler circuit implementation in accordance with a prior approach.

FIG. 12 illustrates a conventional MOS transistor doubler circuit implementation in accordance with a prior approach. The circuit 1200 operates with the normal threshold of the MOS devices and requires a large AC input voltage (identified as RF) to operate well. A first stage 1210 illustrates a CMOS implementation and a second stage 1220 illustrates a NMOS implementation.

Figure 13A:
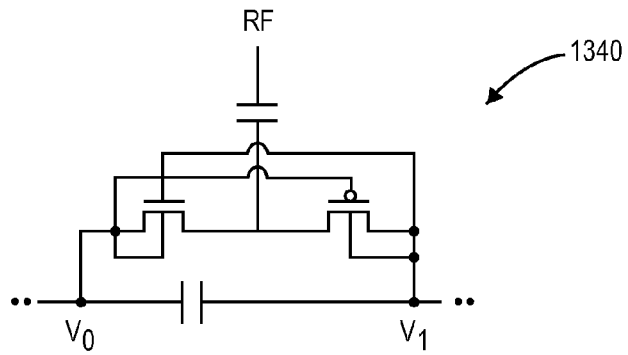
FIGS. 13A and 13B illustrate CMOS transistor doubler circuit implementations in accordance with certain embodiments of the present invention.
Figure 13B:
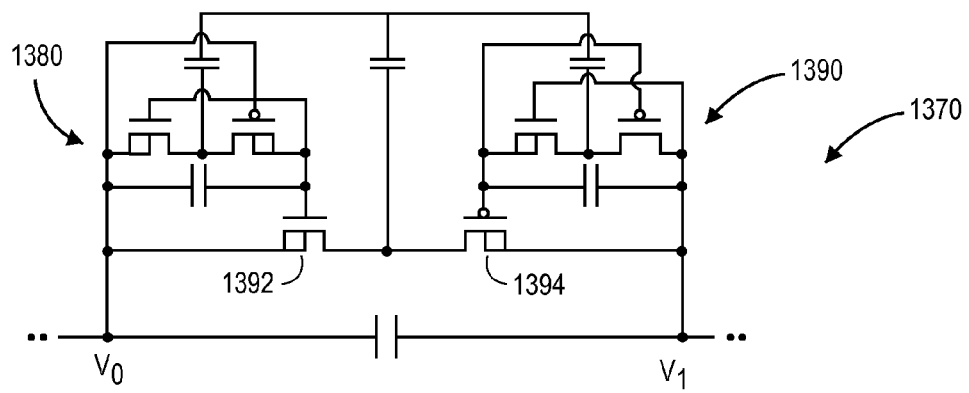

FIGS. 13A and 13B illustrate CMOS transistor doubler circuit implementations in accordance with certain embodiments of the present invention. The circuit 1340 illustrated in FIG. 13A shows an example of cross coupling the gates of the devices to reduce the threshold voltage of the devices by approximately the DC output voltage. However, this circuit was shown in simulations to suffer from a very long start-up time, i.e., the circuit at initial DC voltage of zero volts has no threshold voltage reduction, and therefore has low performance until a significant DC voltage is produced.

The circuit 1370 illustrated in FIG. 13B shows a solution to this problem. Two separate bias circuits 1380 and 1390 are implemented with each bias circuit supplying a gate to source bias, which is independent of the DC output voltage. The bias circuits are similar to the circuit 1340 described above. However, since the bias circuits effectively have no load, they can achieve start-up in a very short time and are not affected by current supplied to the DC output voltage. In addition, since the bias circuit has no load (only leakage and sub-threshold currents), it can produce a higher bias for a given RF input voltage than a loaded version of the circuit 1340, and the rectifying elements 1392 and 1394 operate with a lower effective threshold than with the circuit 1340.

The circuits 1340 and 1370 take advantage of the complementary nature of the N and P transistors to produce a circuit in which no RF voltage is directly applied to a transistor gate.

Figure 14A:
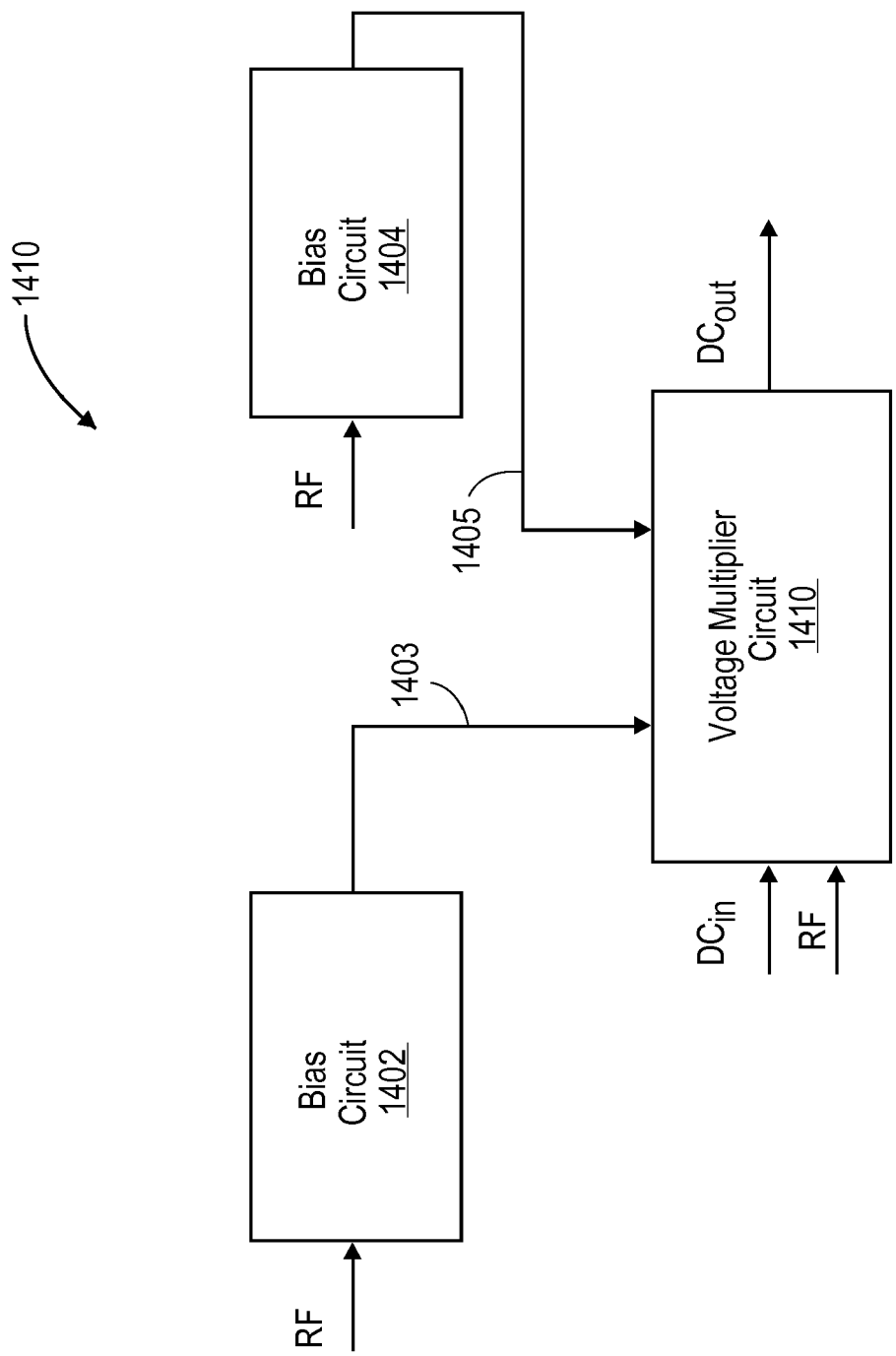
FIG. 14A illustrates a block diagram of a circuit 1400 that receives a RF input source and generates a DC output voltage in accordance with some embodiments of the present invention.

FIG. 14A illustrates a block diagram of a circuit 1400 that receives a RF input source and generates a DC output voltage in accordance with some embodiments of the present invention. The circuit 1400 includes a first bias circuit 1402 to supply a gate to source bias 1403, which is independent of a direct current (DC) output voltage. The circuit 1400 further includes a voltage multiplier circuit 1410 coupled to the first bias circuit 1402. The voltage multiplier circuit 1410 has two or more metal-oxide-semiconductor (MOS) transistors. The voltage multiplier circuit 1410 generates the DC output voltage for powering a RF identification tag in accordance with one embodiment. The first bias circuit 1402 receives the RF input source and generates the gate to source bias 1403 for a gate terminal of one of the MOS transistors. A second bias circuit 1404 receives the RF input source and generates a gate to source bias 1405 for a gate terminal of another one of the MOS transistors.

Figure 14B:
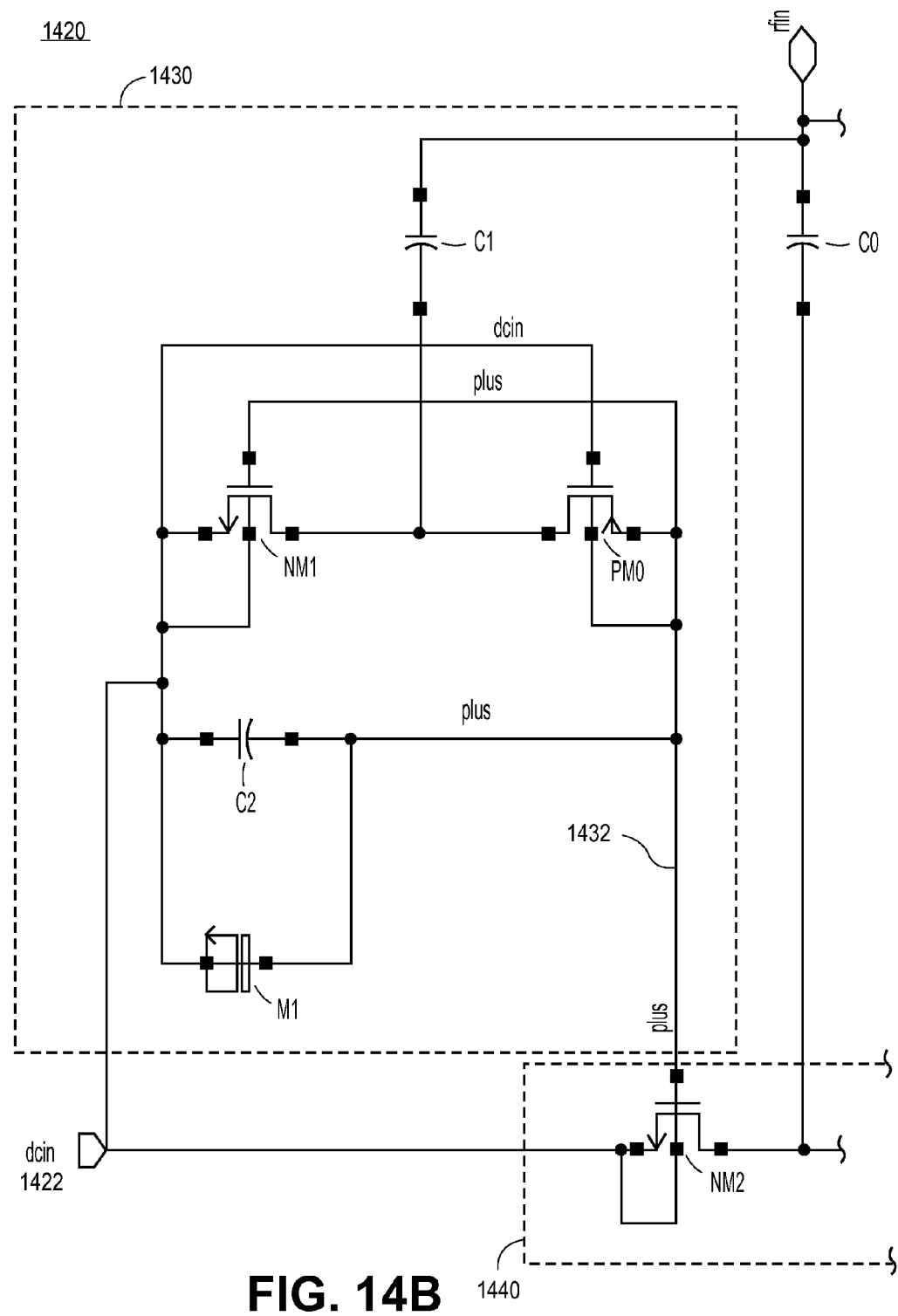
FIG. 14B shows a schematic of a CMOS voltage multiplier circuit in accordance with one embodiment of the present invention.
Figure 14B:
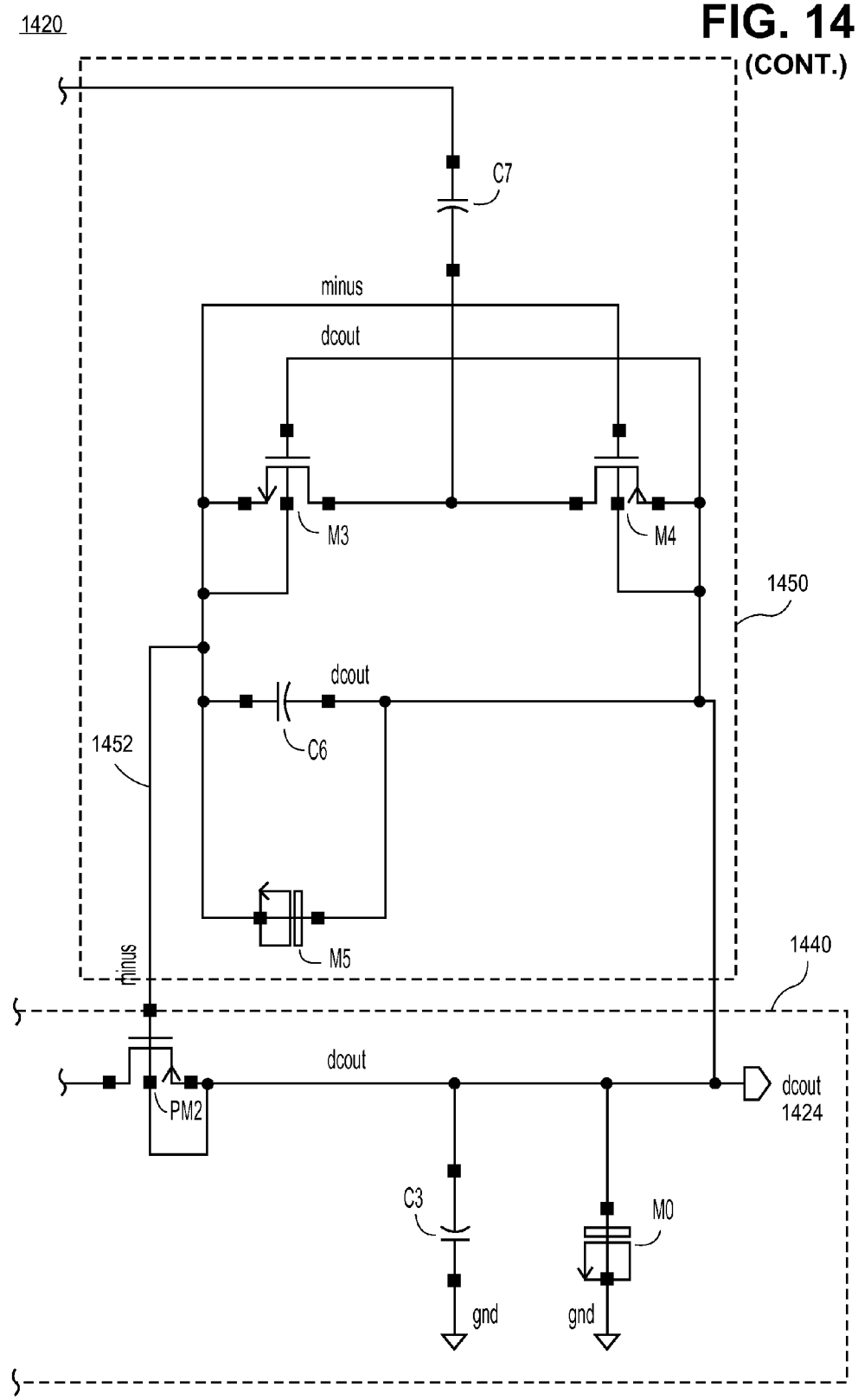

FIG. 14B shows a schematic of a CMOS voltage multiplier circuit in accordance with one embodiment of the present invention. The voltage multiplier circuit 1420 may be fabricated with standard CMOS processing (e.g., 0.16 micron CMOS process) and used as the stages of a multi-stage voltage multiplier (e.g., 6 stage voltage multiplier illustrated in FIG. 16). Multiple types of capacitors are used to increase capacitance density, and the horizontal capacitor shown across the DC output voltage in FIG. 13B is replaced with a device (e.g., C3, M0) to ground.

In one embodiment, this circuit 1420 was found in simulations to be able to supply a voltage of 0.7 volts at a micro amp of current with an input RF voltage at the inputs of the circuit of less than 190 mv. Implementations of the circuit in a CMOS process verified that performance.

This circuit 1420 was found in simulations and implementation to have a compressing effect as the RF input voltage is increased. The DC output voltage can approach a plateau or even decrease as the RF input voltage is increased. The cause of this effect is that the bias voltage becomes high enough to produce operating regions of large reverse current in the rectifying elements (e.g., NM2, PM2). Careful design can prevent this effect from being a problem in a voltage multiplier used to provide a power supply, where the minimum and maximum required voltages are fairly close together. In an application where more linearity is required, the circuit needs to be modified.

The circuit 1420 includes a bias circuit 1430 to supply a gate to source bias 1432, which is independent of a direct current (DC) output voltage 1424. The circuit 1420 further includes a voltage multiplier circuit 1440 that is coupled to the separate bias circuit 1430. In one embodiment, the voltage multiplier circuit 1440 has at least one n-channel metal-oxide-semiconductor (NMOS) transistor (e.g., NM2) and at least one p-channel metal-oxide-semiconductor (PMOS) transistor (e.g., PM2) and also includes C0. The voltage multiplier circuit 1440 generates the DC output voltage for powering a RF identification tag in accordance with one embodiment. The bias circuit 1430 receives the RF input source and generates the gate to source bias 1432 for a gate terminal of one of the MOS transistors (e.g., NM2). A second bias circuit 1450, separate from the circuit 1440, receives the RF input source and generates a gate to source bias 1452 for a gate terminal of one of the MOS transistors (e.g., PM2).

The bias circuit 1430 generates the gate to source bias 1432 for a gate terminal of one of the NMOS transistors to DC bias the NMOS transistor (e.g., NM2) within a certain range (e.g., approximately 100 to 200 milliVolts) of a threshold voltage of the NMOS transistor or substantially to the threshold voltage. In one embodiment, the bias circuit 1430 is coupled in series between a gate of one of the NMOS transistors (e.g., NM2) of the voltage multiplier circuit 1440 and a DC voltage input (e.g., dcin 1422) to the voltage multiplier circuit 1440. The bias circuit 1450 generates a gate to source bias 1452 for a gate terminal of one of the PMOS transistors (e.g., PM2) to DC bias the PMOS transistor within a certain range of a threshold voltage of the PMOS transistor or substantially to the threshold voltage.

In one embodiment, the bias circuit 1430 includes NM1, PM0, C1, C2, and M1. A gate terminal of the NMOS transistor (e.g., NM1) of the bias circuit 1430 is coupled to a source terminal of the PMOS transistor (e.g., PM0) of the bias circuit 1430 and a gate terminal of the PMOS transistor is coupled to a source terminal of the NMOS transistor in order to lower threshold voltages of the NMOS and PMOS transistors. The RF input source is not directly applied to any of the gate terminals of the MOS transistors in the bias circuits or in the voltage multiplier circuit.

In another embodiment, the voltage multiplier circuit is implemented with NMOS transistors rather than NMOS and PMOS transistors as illustrated in FIG. 14B. In yet another embodiment, the voltage multiplier circuit is implementing with PMOS transistors.

Figure 15:
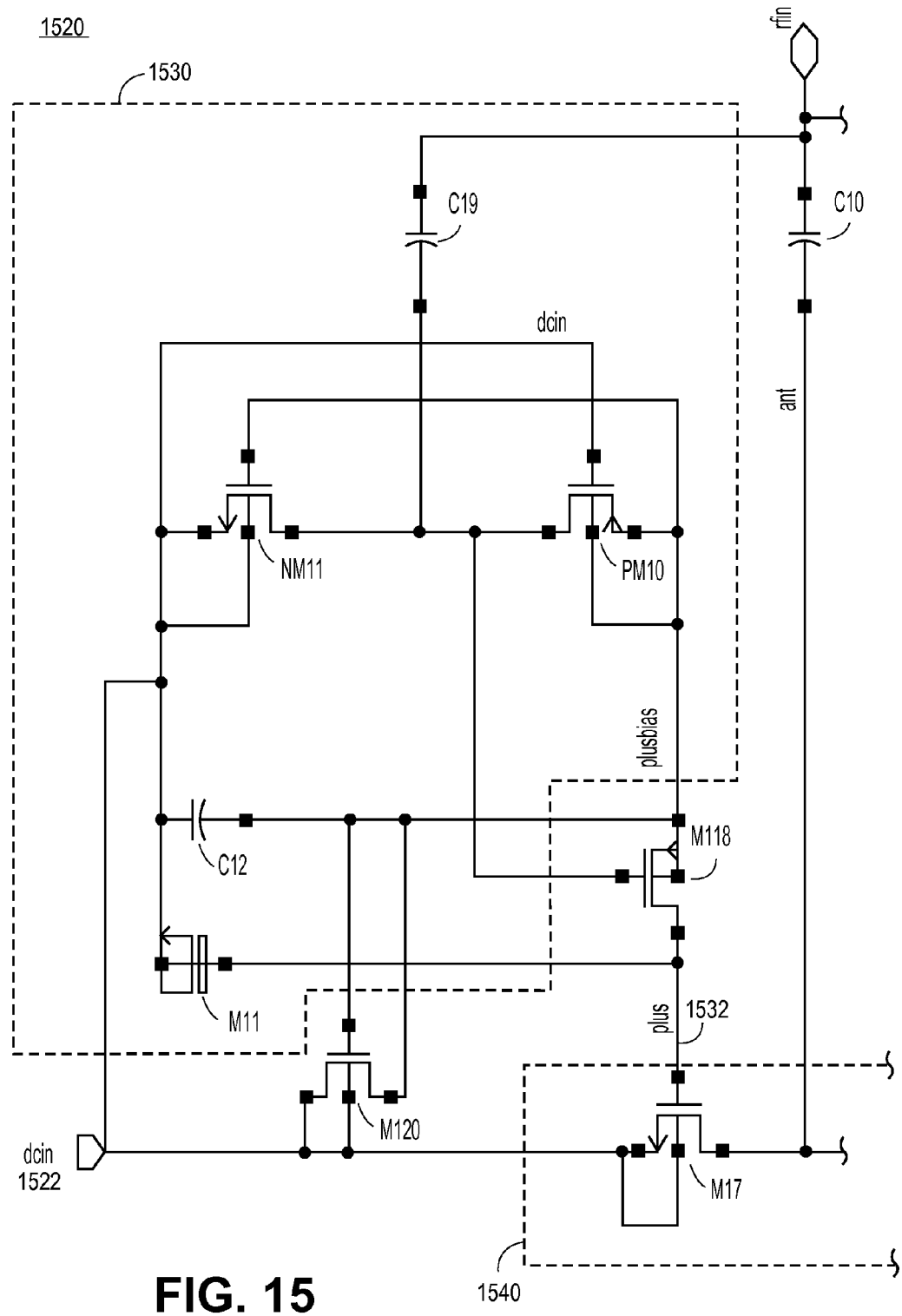
FIG. 15 shows a schematic of a doubler circuit suitable for use as a demodulator in accordance with one embodiment of the present invention.
Figure 15:
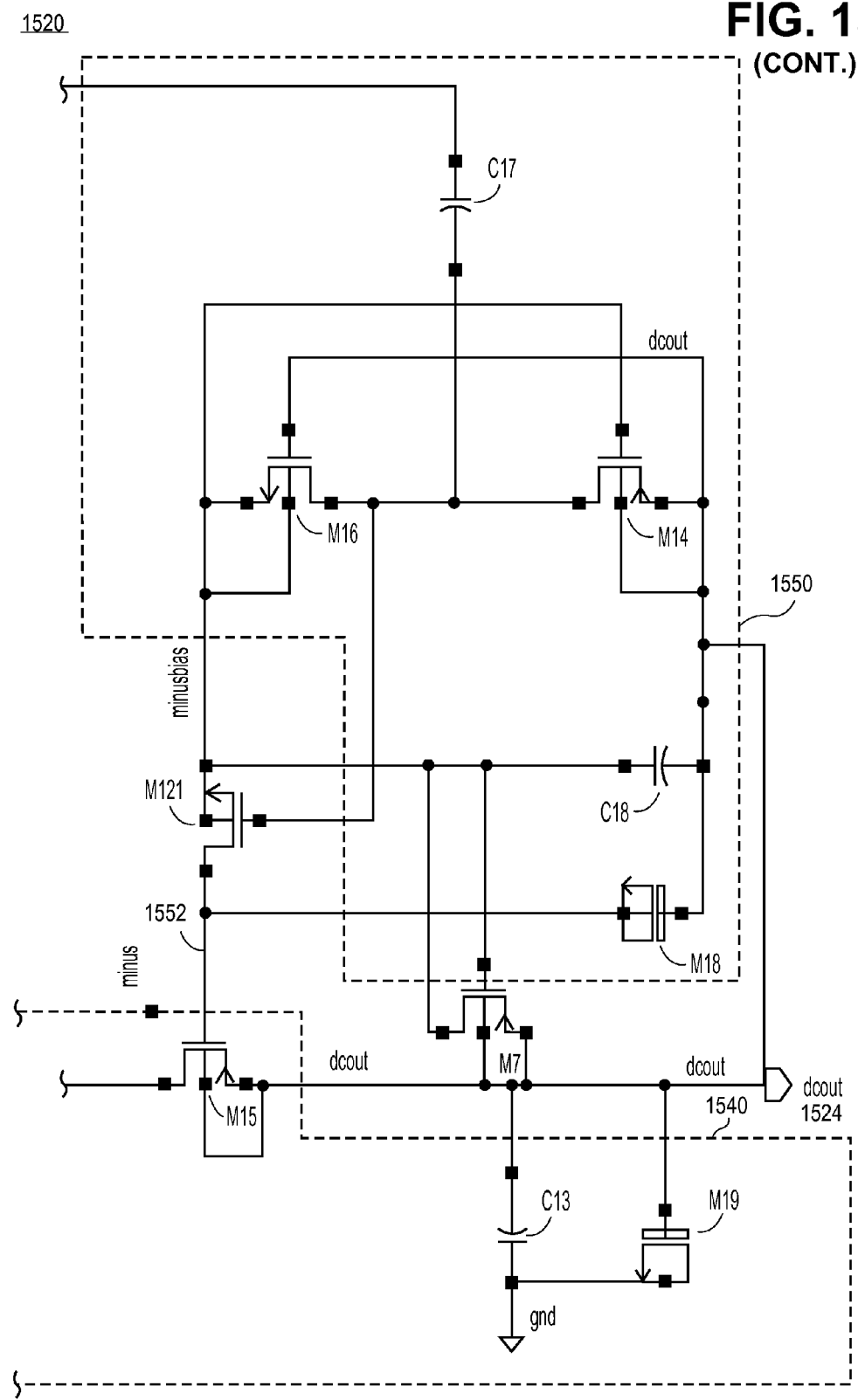

FIG. 15 shows a schematic of a doubler circuit suitable for use as a demodulator in accordance with one embodiment of the present invention. The main difference between the circuit 1520 and the circuits 1400 or 1420 is that a clamping transistor device (e.g., M120, M7) is used to limit the value of the bias voltage to approximately one transistor threshold or below. Additional regulation is performed on the bias voltage applied to the rectifying elements (e.g., M17, M15) by the use of an RF-operated isolation switch (e.g., M118, M121). Even with the clamp device, the bias voltage is not well regulated when the RF input voltage is decreased, and the clamped voltage will decrease somewhat during low excursions (as during modulation) of the RF input voltage. The isolation switch ensures that the rectifier biases are not pulled down during the low RF input voltage excursions. In simulations, this circuit 1520 provides much more linear demodulation and fewer artifacts than the circuits 1400 or 1420 used in the power supply voltage multiplier.

In one embodiment, a demodulator circuit 1520 includes a bias circuit 1530 to supply a gate to source bias 1532 to a voltage multiplier circuit 1540. The circuit 1520 also includes a clamping transistor (e.g., M120) coupled to the bias circuit 1530. The circuit 1520 also includes the voltage multiplier circuit 1540 that is coupled to the clamping transistor. The voltage multiplier circuit 1540 has at least one n-channel metal-oxide-semiconductor (NMOS) transistor (e.g., M17) and/or at least one p-channel metal-oxide-semiconductor (PMOS) transistor (e.g., M15). The voltage multiplier circuit 1540 generates a demodulated output signal 1524 that demodulates information carried by a RF input signal. The bias circuit 1530 receives the RF input signal and generates the gate to source bias 1532 for a gate terminal of one of the MOS transistors (e.g., M17). The clamping transistor (e.g., M120) limits a value of the gate to source bias to approximately one threshold voltage of the clamping transistor or less. The bias circuit 1530 generates the gate to source bias for a gate terminal of one of the NMOS transistors to DC bias the NMOS transistor (e.g., M17) within a certain range (e.g., approximately 100 to 200 milliVolts) of a threshold voltage of the NMOS transistor or substantially to the threshold voltage. The bias circuit 1530 is coupled in series between a gate of one of the NMOS transistors and a DC voltage input 1522 to the voltage multiplier circuit 1540.

The circuit 1520 also includes a bias circuit 1550 to receive the RF input source and generate a gate to source bias for a gate terminal of one of the MOS transistors. A clamping transistor (e.g., M7) is coupled to the bias circuit 1550. The clamping transistor limits a value of the gate to source bias to approximately one threshold voltage of the second clamping transistor or less.

The circuit 1520 also includes an isolation switch (e.g., M118) that is coupled to the bias circuit 1530. The isolation switch regulates the voltage bias generated by the bias circuit 1530. In a similar manner, an isolation switch (e.g., M121) regulates the voltage bias generated by the bias circuit 1550.

In another embodiment, the circuit 1520 is altered to be implemented with merely NMOS transistors rather than NMOS and PMOS transistors as illustrated in FIG. 15. In yet another embodiment, the circuit 1520 is altered to be implemented with merely PMOS transistors.

In certain embodiments, the circuit 1520 is altered to enhance the light insensitivity of the circuit. Body contacts of PM10 and M118 can be connected to dcout and the body contacts of M16 and M121 can be connected to dcin.

Figure 16:
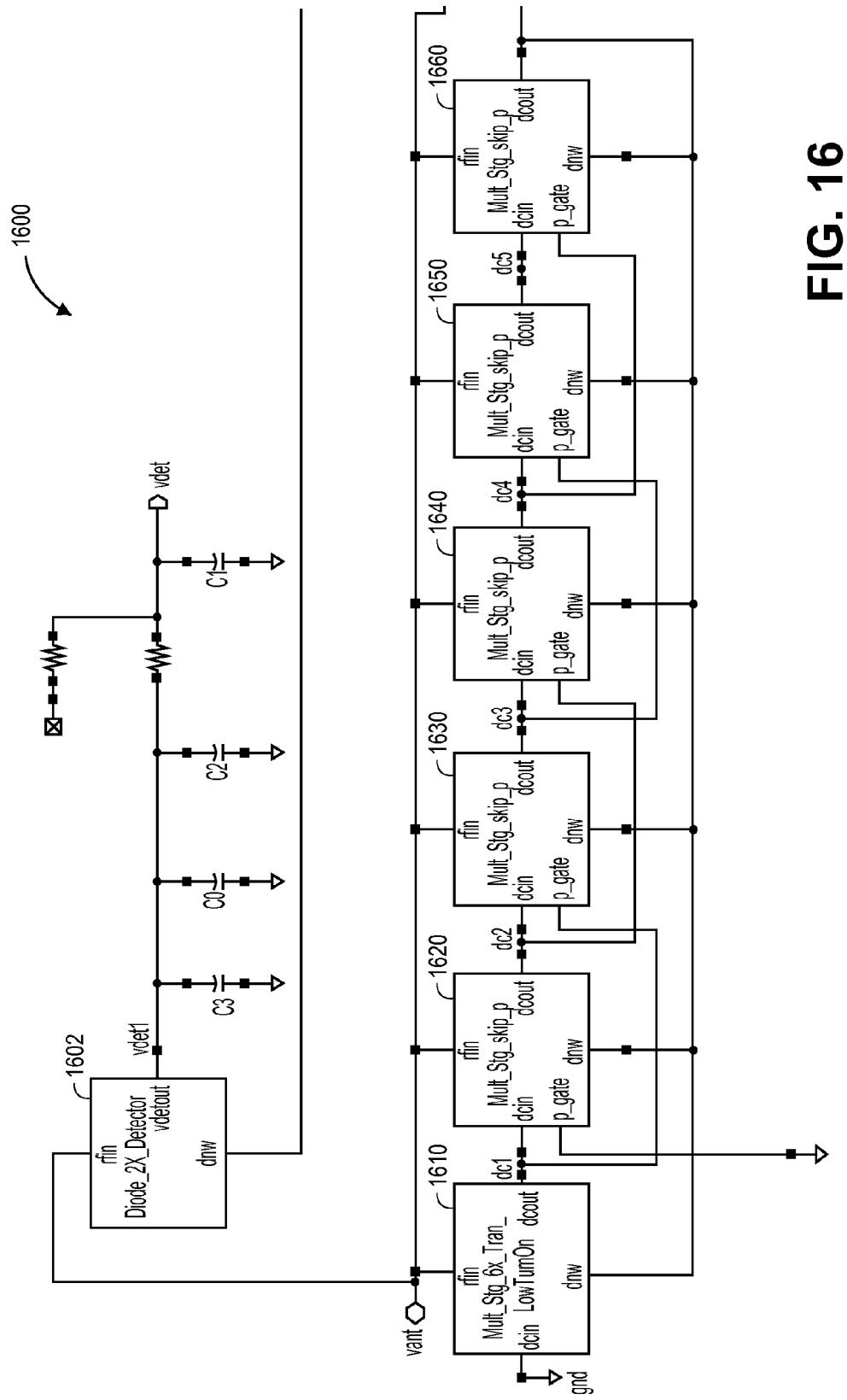
FIG. 16 shows a schematic of a CMOS multi-stage voltage multiplier circuit in accordance with one embodiment of the present invention.

FIG. 16 shows a schematic of a CMOS multi-stage voltage multiplier circuit in accordance with one embodiment of the present invention. The multi-stage voltage multiplier circuit 1600 may be fabricated with standard CMOS processing (e.g., 0.16 micron CMOS process). In certain embodiments, each stage 1610, 1620, 1630, 1640, 1650, and 1660 of the multi-stage circuit 1600 is one of the voltage multiplier circuit 1400, 1420, or an alternative implementation such as the circuit 1700 to be discussed below or a NMOS implementation or a PMOS implementation. The detector circuit 1602 may be implemented with the circuit 1520 discussed above or a NMOS implementation or a PMOS implementation.

In one embodiment, the multi-stage voltage multiplier circuit 1600 includes a first stage 1610 of the multi-stage voltage multiplier circuit. This stage includes a bias circuit (e.g., 1402, 1430) having no effective load, a voltage multiplier circuit (e.g., 1410, 1440) that is coupled to the bias circuit, and another bias circuit (e.g., 1404, 1450) that is also coupled to the voltage multiplier circuit. The stage 1610 includes similar components and functionality as described above in conjunction with the circuits 1400 and 1420 or described below in conjunction with FIG. 17A.

A second stage 1620 and subsequent stages may include similar components and functionality as described above in conjunction with the circuits 1400 and 1420. Alternatively, the second stage 1620 and subsequent stages may include an alternative implementation of the circuits 1400 and 1420 as illustrated in FIG. 17B and described below.

Figure 17A:
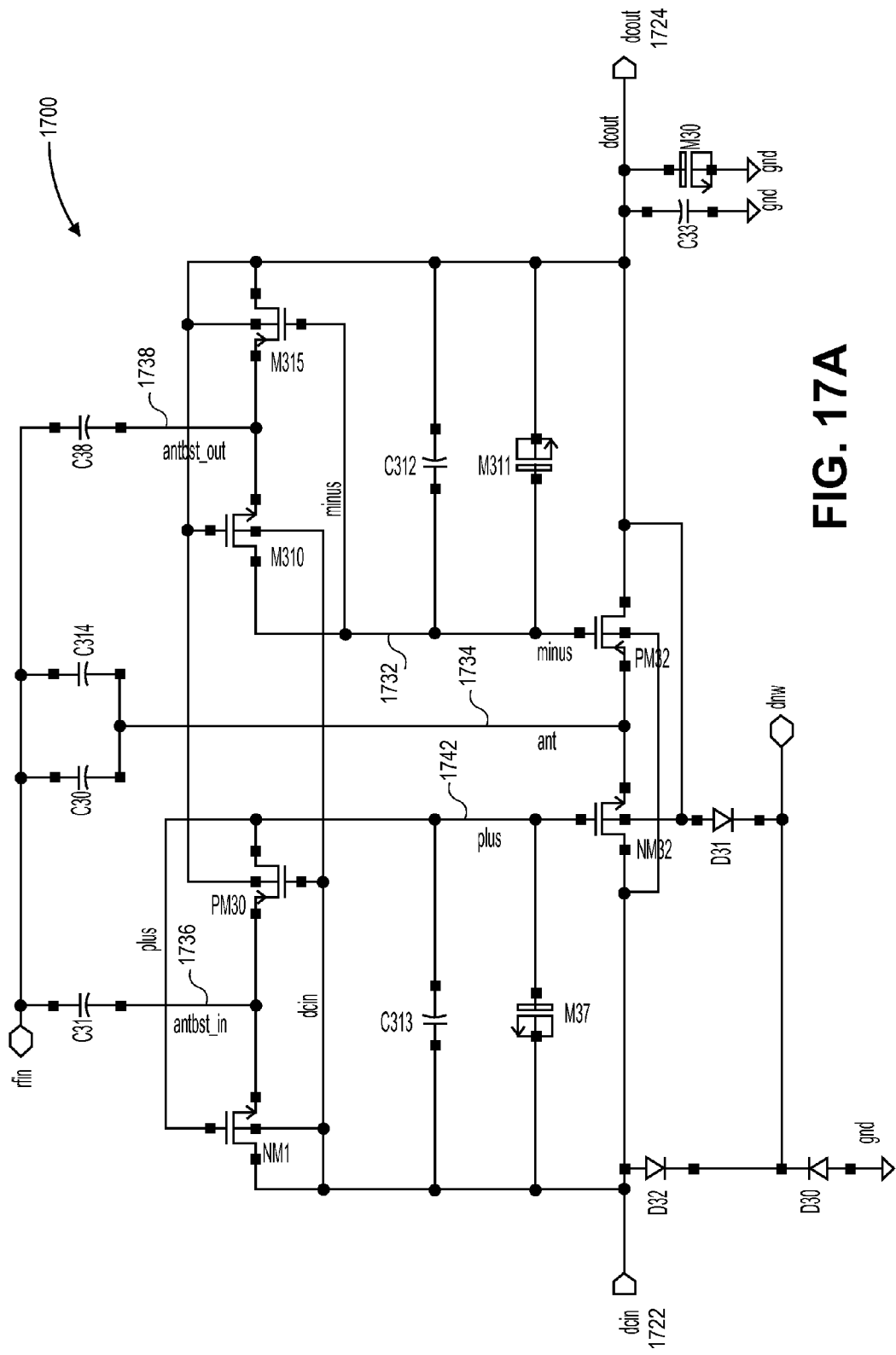
FIG. 17A shows a schematic of a CMOS voltage multiplier circuit in accordance with another embodiment of the present invention.
Figure 17B:
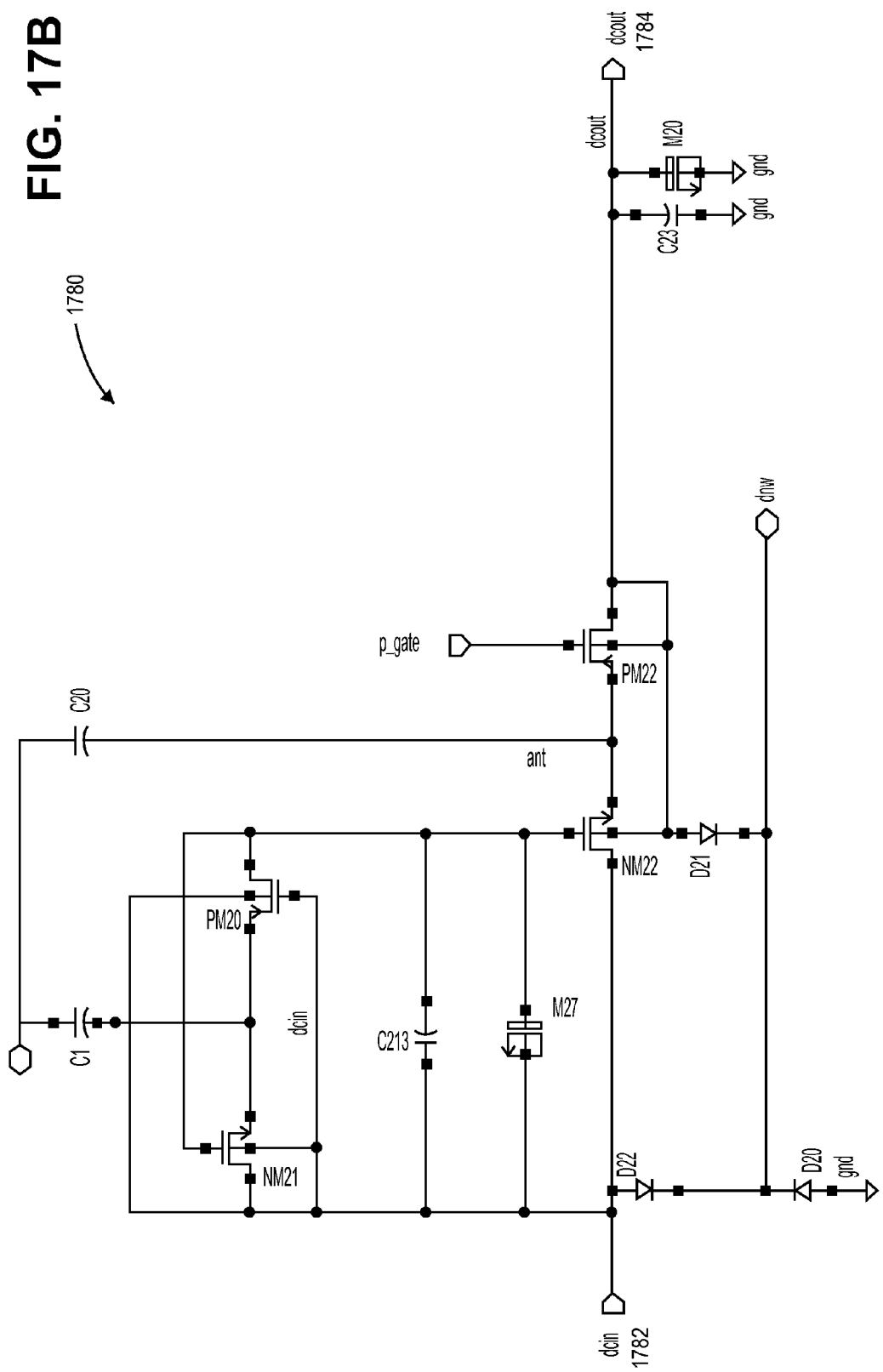
FIG. 17B shows a schematic of a CMOS voltage multiplier circuit in accordance with yet another embodiment of the present invention.

In one embodiment, the circuit shown in FIG. 17A shows a preferred implementation of this invention where the light insensitivity of the multiplier is improved by tying the body and isolation wells of the multiplier to low impedance nodes of the power multiplier, rather than the high impedance nodes at the gates of the power multiplier. The body and isolation well of the NFET (e.g., NM32) is tied to the higher DC out node of the doubler, and the body of the PFET (e.g., PM32) is tied to the lower DC in node in order to use the back gate effect to lower the threshold of the devices.

FIG. 17A shows a schematic of a CMOS voltage multiplier circuit in accordance with another embodiment of the present invention. The voltage multiplier circuit 1700 may be fabricated with standard CMOS processing (e.g., 0.16 micron CMOS process) and used as one or more stages of a multi-stage voltage multiplier (e.g., circuit 1600). In an embodiment, the circuit 1700 is used for the first stage 1610. The circuit 1700 includes similar devices and functionality in comparison to the circuits 1400 and 1420. However, the body contacts of some of the MOS devices in FIG. 17A are connected to low impedance nodes of the power multiplier, rather than the high impedance nodes at the gates of the power multiplier to improve the light insensitivity of the multiplier. For example, the body contacts of PM30, M310, and PM32 are connected to dcin and the body contact of NM32 is connected to dcout.

The circuit 1700 includes antbst_in 1736, antenna 1734, antbst_out 1738, gate to source bias 1742, gate to source bias 1732, dcin 1722, and dcout 1724.

In another embodiment, the circuit 1700 is altered to be implemented with merely NMOS transistors rather than NMOS and PMOS transistors as illustrated in FIG. 17A. In yet another embodiment, the circuit 1700 is altered to be implemented with merely PMOS transistors.

FIG. 17B shows a schematic of a CMOS voltage multiplier circuit in accordance with another embodiment of the present invention. The voltage multiplier circuit 1700 may be fabricated with standard CMOS processing (e.g., 0.16 micron CMOS process) and used as one or more stages of a multi-stage voltage multiplier (e.g., circuit 1600). In an embodiment, the circuit 1780 is used for the second stage 1620 and subsequent stages. The circuit 1780 includes similar devices and functionality in comparison to the circuits 1400 and 1420. However, the second bias circuit (e.g., 1404, 1450) from the circuits 1400 and 1420, respectively, is removed or disconnected from the circuit 1780. The bias for the gate terminal of the PMOS transistor (e.g., PM22) is connected to ground for the second stage 1620 as illustrated in FIG. 16. The bias for the gate terminal of the PMOS transistor (e.g., PM22) is connected to an intermediate voltage output node (e.g., dc1, dc2, dc3, dc4) for subsequent stages 1630, 1640, 1650, 1660, respectively, as illustrated in FIG. 16. The DC output of a stage (e.g., 1610, 1620, 1630, 1640, 1650) is feed as a DC input for a subsequent stage (e.g., 1620, 1630, 1640, 1650, 1660). Stage 1660 generates the DC output used to supply power for a chip (e.g., RF ID tag). In other embodiments, fewer or more stages can be combined for multiplying voltage and generating a DC output voltage for a RF ID tag.

In another embodiment, the circuit 1780 is altered to be implemented with merely NMOS transistors rather than NMOS and PMOS transistors as illustrated in FIG. 17B. In yet another embodiment, the circuit 1780 is altered to be implemented with merely PMOS transistors.

Temperature Sensing RFID Tag

In one embodiment, an RFID tag incorporates an oscillator whose frequency varies with temperature. The oscillation frequency of the tag is used to infer the approximate temperature of the tag. A passive RFID tag incorporates an oscillator whose frequency varies with temperature. The oscillation frequency of the tag is used to infer the approximate temperature of the tag. A RFID tag incorporates an oscillator whose frequency varies. The oscillation frequency of the tag is used to infer some physical property of the tag or of the environment that the tag is in, or of some input to the tag.

An RFID tag with an oscillator whose frequency varies with temperature is compared to the frequency of another oscillator at the interrogator. Calibration information regarding the frequency of the oscillator at the tag is stored, and then used together with the oscillation frequency of the tag at a time, to infer the approximate temperature of the tag.

An RFID tag with an oscillator whose frequency varies with temperature, and whose frequency does not vary substantially with light, has an oscillation frequency which is compared to another oscillator at the interrogator. Calibration information regarding the frequency of the oscillator at the tag is stored, and then used together with the oscillation frequency of the tag at a time, to infer the approximate temperature of the tag.

An RFID tag includes a tag oscillator, and the tag starts counting oscillations beginning at a specified time, and then stops counting at another specified time, and the number of oscillations is returned to the interrogator. The interrogator then uses the number of oscillations returned, along with the calibration information to infer the temperature of the tag.

A reader sends a first calibration time marker to a tag, such as the rising edge of an amplitude modulated signal; and then a second calibration time mark to the tag, such as the rising edge of another amplitude modulated signal, and the tag stores a number corresponding to the amount of time between the two calibration time markers into a register, for return to the reader when a command is sent to retrieve information from the tag.

A reader sends a first calibration time marker to a tag, such as the rising edge of an amplitude modulated signal; and then a second calibration time mark to the tag, such as the rising edge of another amplitude modulated signal, and the tag stores a number corresponding to the amount of time between the two calibration time markers into a register which is mapped into the tag memory map.

Calibration information regarding the frequency of an oscillator at the tag is stored in the tag long term memory. Calibration information regarding the frequency of an oscillator at the tag under various conditions is stored in the tag long term memory. Calibration information regarding the frequency of an oscillator at the tag at different temperatures is stored in the tag long term memory.

As an example of an oscillator which varies with temperature, consider the current biased oscillator of FIG. 11. Transistors P1, P2, N1, and N2 in concert with resistor R establish a bias current I. This current is mirrored in devices P3, P4, and P5. Vout is an oscillating voltage with frequency inversely proportional to the value of I. If the resistor R is implemented with a polysilicon resistor, then its resistivity goes down as its temperature increases. The oscillation frequency then goes up monotonically as the temperature of the RFID tag increases.

In some embodiments, RF systems include RF ID readers and tags that can be used for various applications, such as described in U.S. Provisional Patent Application 60/904,590, which is incorporated herein for all purposes).

Figure 18:
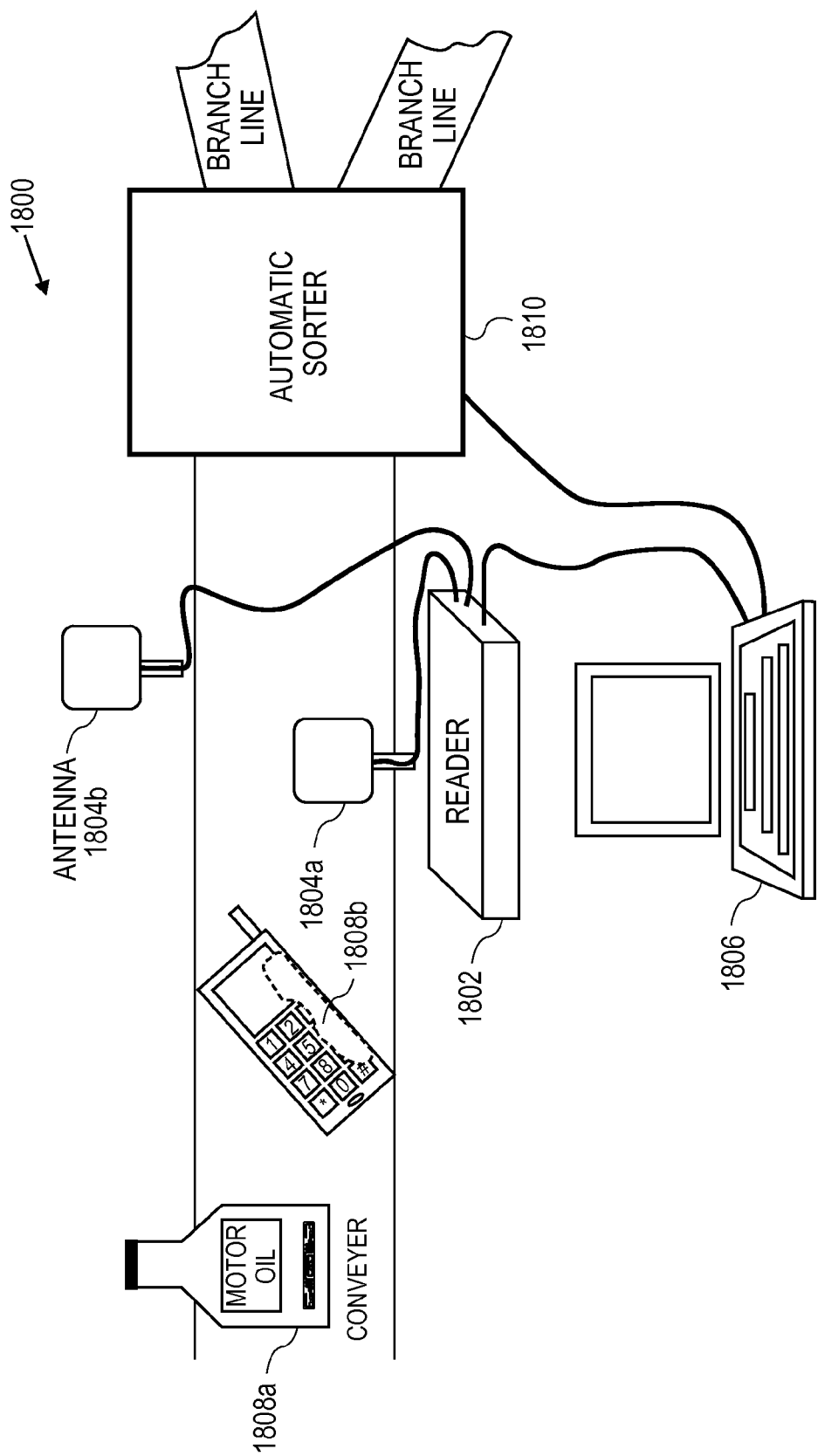
FIG. 18 illustrates an exemplary RFID system according to an embodiment of the present invention.

FIG. 18 illustrates an exemplary RFID system 1800 according to an embodiment of the present invention. System 1800 includes a reader 1802 coupled to antennas 1804a, 1804b and computer 1806. Reader 1802 can be operating in a bistatic, monostatic, or multistatic mode with the antennas. As illustrated in FIG. 18, tags 1808a, 1808b are physically coupled to items to be identified. These items are moved along a conveyer and recycle codes read by reader 1802. This recycle information is provided to automatic sorter 1810. Sorter 1810 can segregate items based on their respective recycle information using magnets, sifters, centrifuges, fluid separators, vacuum loaders, or other known techniques to divert items (or a constituent material, gas, liquid, or sludge) to an appropriate branch line, bin, receptacle, compactor, or hopper. Automatic sorting can provide greater efficiency over manual sorting requiring visual inspection of items. It can also reduce or eliminate the need for private consumers to pre-sort their refuse before collection. Although FIG. 18 depicts a distributed system 1800, an alternative system can include a reader, antennas, computer, and automatic sorter integrated into a single piece of equipment. In a specific embodiment, system 1800 can also include decontamination equipment (e.g., to wash, heat, or sterilize) and containment equipment for hazardous waste. Decontaminants can include alcohol solution, ethylene oxide, water, detergent, hydrogen peroxide, sodium hydroxide, chloramines solutions, hot steam, hot air stream, and the like.

Figure 19:
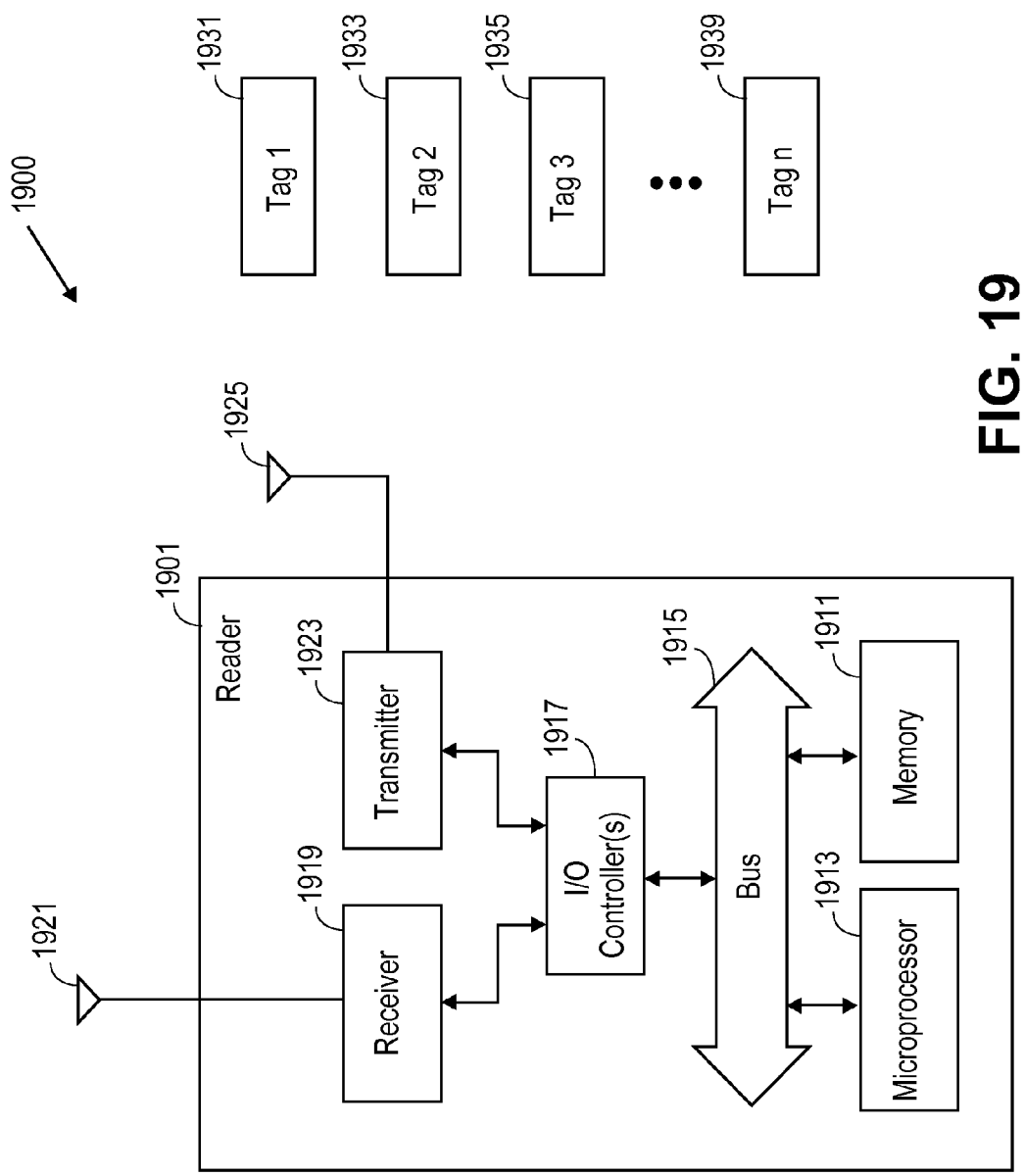
FIG. 19 shows an example of an RFID system according to one embodiment of the present invention.

FIG. 19 illustrates an exemplary radio frequency identification (RFID) system 1900, which includes an RFID reader 1901 and a plurality of RFID tags 1931, 1933, 1935, . . . , and 1939. The system can be either a reader-talks-first or tag-talks-first system using passive, semi-passive, or active tags. Reader 1901 typically includes a receiver 1919 and a transmitter 1923 (alternatively, a transceiver), each of which is coupled to an I/O (input/output) controller 1917. The receiver 1919 may have its own antenna 1921, and the transmitter 1923 may have its own antenna 1925. It will be appreciated by those in the art that the transmitter 1923 and the receiver 1919 may share the same antenna provided that there is a receive/transmit switch which controls the signal present on the antenna and which isolates the receiver and transmitter from each other. The receiver 1919 and the transmitter 1923 may be similar to receiver and transmitter units found in conventional readers. In North America, the receiver and transmitter for RFID typically operate in a frequency range of about 915 megahertz (e.g., 902 MHz-928 MHz) using spread spectrum techniques (e.g., frequency hopping). In Europe, the frequency range is about 866 megahertz (e.g., 865.7 MHz-867.7 MHz). Other regions have set aside, or are in the process of setting aside, frequency ranges for operation—these ranges of operation typically lie somewhere in the overall range of 200 MHz to 5 GHz. Each is coupled to the I/O controller 1917 which controls the receipt of data from the receiver and the transmission of data, such as commands, from the transmitter 1923. The I/O controller is coupled to a bus 1915 which is in turn coupled to a microprocessor 1913 and a memory 1911.

There are various different possible implementations for the processing system represented by elements 1911, 1913, 1915, and 1917, which may be used, for example, in the exemplary RFID reader 1901 of FIG. 19. In one embodiment, the microprocessor 1913 is a programmable microcontroller, such as an 8051 microcontroller or other well-known microcontrollers or microprocessors (e.g. a PowerPC microprocessor) and the memory 1911 includes dynamic random access (DRAM) memory. Memory 1911 may also include a non-volatile read only memory for storing data and software programs. The memory 1911 typically contains a program which controls the operation of the microprocessor 1913 and also contains data used during the processing of tags as in the interrogation of tags. In some embodiments of the present invention, the memory 1911 would typically include a computer program which causes the microprocessor 1913 to decode received tag data with the appropriate tag-to-reader protocol scheme. The reader 1901 may also include a network interface (not shown in Fig.), such as an Ethernet interface, universal bus interface, or Wi-Fi interface (such as IEEE 802.11, 802.11a, 802.11b, 802.16a, Bluetooth, Proxim's OpenAir, HomeRF, HiperLAN and others), which allows the reader to communicate to other processing systems through a network, including without limitation an inventory management system, central store computer, personal computer, or database server. The network interface would typically be coupled to the bus 1915 so that it can receive data, such as the list of tags identified in an interrogation, from either the microprocessor 1913 or from the memory 1911.

Figure 20:
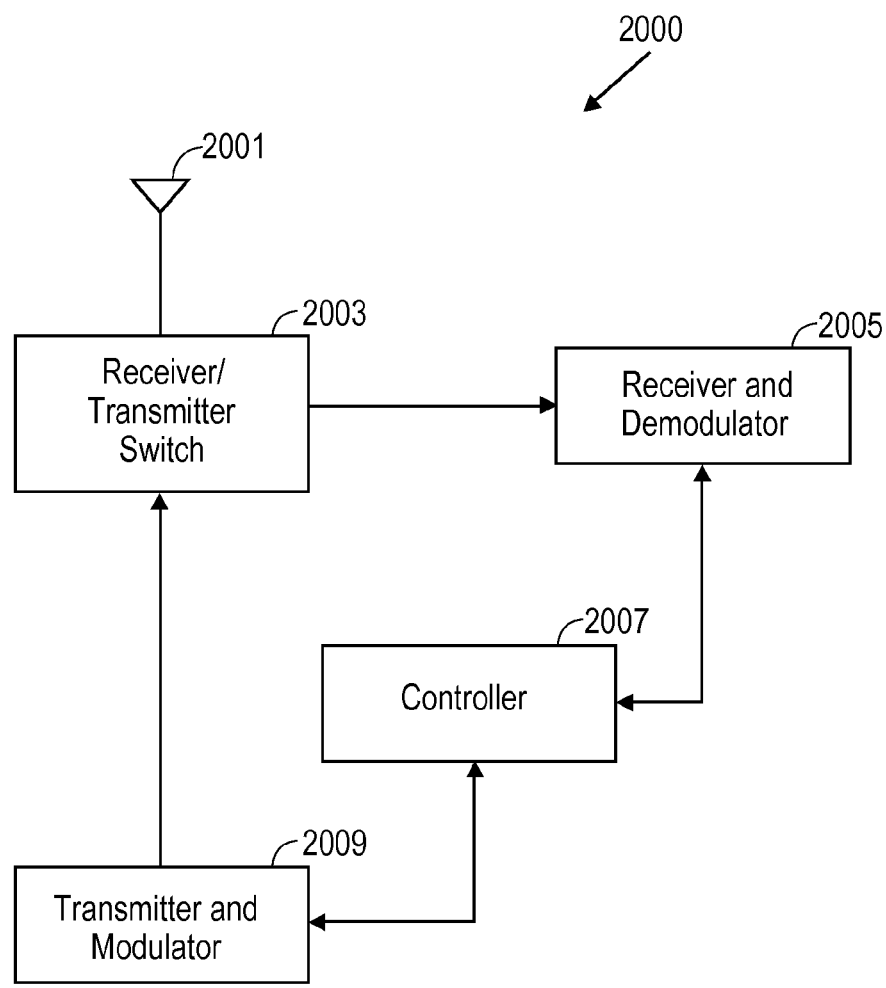
FIG. 20 shows an exemplary embodiment of an RFID tag according to an embodiment of the present invention.

FIG. 20 shows an example of one implementation of a radio frequency identification (RFID) tag which may be used with the present invention. The tag 2000 includes an antenna 2010 (alternatively, two, three or more antennas) which is coupled to a receive/transmit switch 2030. This switch is coupled to the receiver and demodulator 2050 and to the transmitter and modulator 2090. A controller unit 2070 is also coupled to the receiver/demodulator 2050 and to the transmitter/modulator 2090. The particular exemplary RFID tag shown in FIG. 20 may be used in various embodiments of the present invention in which data is maintained in a memory (not shown in FIG. 20). The receiver and demodulator 2050 receives signals through the antenna 2010, e.g., interrogation signals from a reader (not shown in FIG. 20), and the switch 2030 receives and demodulates the signals and provides these signals to the controller unit 2070. Commands received by the receiver 2050 are passed to the controller of the unit 2070 in order to control the operation of the tag. Any additional data received by the receiver 2050 is also passed to the control unit 2070, and this data may include handshaking data (e.g., parameters for a tag-to-reader encoding protocol). The transmitter and modulator 2090, under control of the control unit 2070, transmits responses to the commands or other processed data through the switch 2030 and the antenna 2010 to the reader. It will be appreciated by those skilled in the art that the transmitter may be merely a switch or other device which modulates reflections from an antenna, such as antenna 2010.

In certain embodiments of the present invention, RFID tags may be designed with a small integrated circuit (IC) area, a small memory, atomic transactions to minimize tag state storage requirements, and the like. This type of design will lower the tag production cost, thereby enabling wide-scale adoption of RFID labeling in a variety of industries, for example, in the supply chain.

Figure 21:
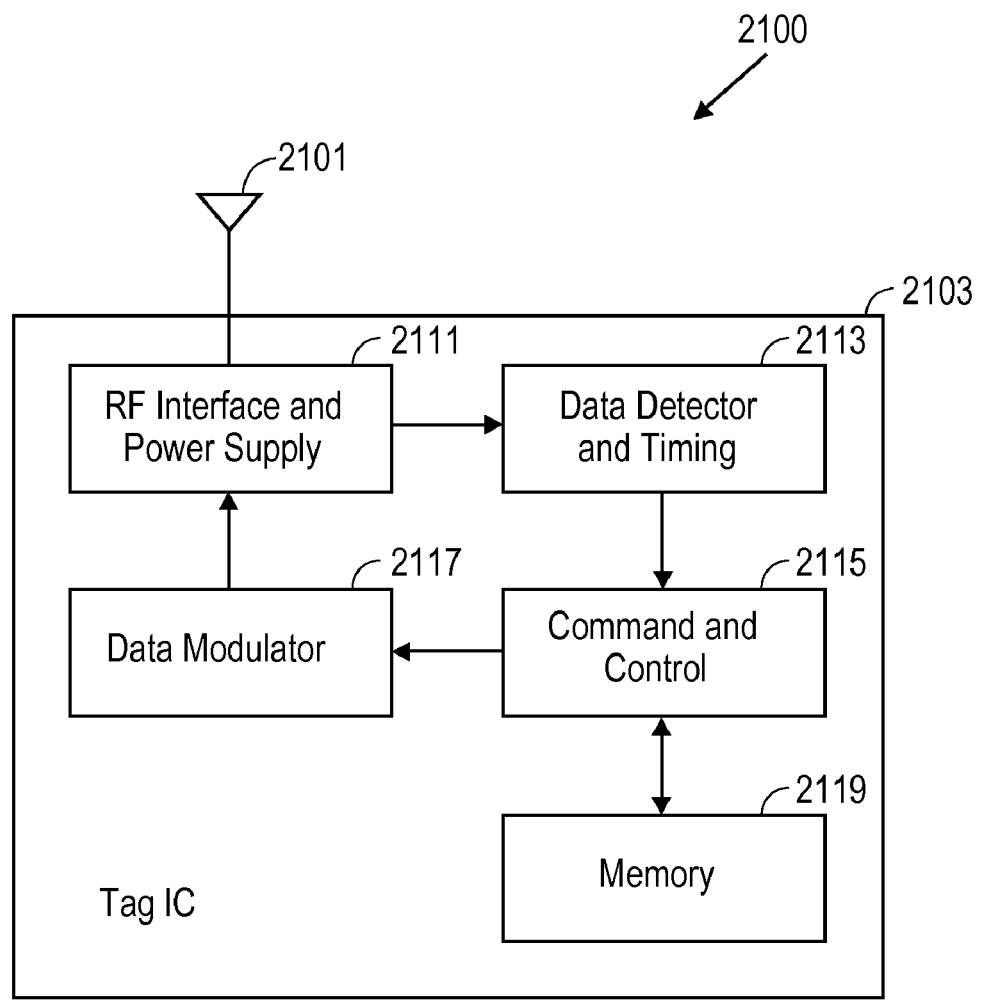
FIG. 21 shows an example of an RFID tag according to another embodiment of the present invention.

FIG. 21 shows an example of a low cost tag 2100. The tag 2100 includes an antenna 2101 and an integrated circuit (IC) 2103, coupled together. Tag IC 2103 implements the command protocol and contains data such as an EPC. The antenna 2101 receives the reader-generated interrogation signals and reflects the interrogation signal back to the reader in response to a modulation signal created by the tag IC 2103. The exemplary tag IC 2103 comprises a radio frequency (RF) interface and power supply 2111 (e.g., circuits 1400, 1420, 1700, stages from circuit 1600), data detector (e.g., circuit 1520) and timing circuit 2113, command and control 2115, data modulator 2117, and memory 2119. In one embodiment, command and control 2115 may include static logic (such as a state machine) which implements communication protocols according to various embodiments of the present invention.

The RF interface and power supply 2111 converts the RF energy into the DC power required for the tag IC 2103 to operate and provides modulation information to the data detector and timing circuit 2113. The RF interface also provides a means of coupling the tag modulation signals to the antenna for transmission to the reader. The data detector and timing circuit 2113 demodulates the reader signals and may generate timing and data signals used by the command and control 2115, including a subcarrier sequence. The command and control 2115 coordinates all of the functions of the tag IC 2103. The command and control 2115 may include state logic to interpret data from the reader, perform the required internal operations, and determine if and/or how the tag will respond to the reader. The memory 2119 contains the EPC, which may be associated with the tagged item. The data modulator 2117 translates the binary tag data into a tag-to-reader encoded signal that is then applied to the RF interface 2111 and transmitted to the reader (e.g., reader 501 of FIG. 5). In one embodiment, IC 2103 is a NanoBlock™ IC made by Alien Technology Corporation of Morgan Hill, Calif.

The design and implementation of RFID tags can be characterized in terms of layers. For example, a physical and environmental layer characterizes the mechanical, environmental, reliability and manufacturing aspects of a tag, an RF transport layer characterizes RF coupling between reader and tag, and a communication layer characterizes communications/data protocols between readers and tags. Various different implementations of tags at different layers can be used with embodiments of the present invention. It is understood that the implementations of the tags are not limited to the examples shown in this description. Different tags or communication devices can use methods and apparatuses of the embodiments of the present invention for communication according to the needs of the particular application.

In one embodiment of the present invention, a tag may be fabricated through a fluidic self-assembly process. For example, an integrated circuit (e.g., 2103 of FIG. 21) may be fabricated with a plurality of other integrated circuits in a semiconductor wafer. The integrated circuit will include, if possible, all the necessary logic of a particular tag, possibly excluding the antenna 2101. Thus, all the logic shown in the tag 2100 would be included on a single integrated circuit and fabricated with similar integrated circuits on a single semiconductor wafer. Each circuit may be programmed (or pre-programmed) with a unique identification code and then singulated (and shaped) from the wafer. Integrated circuit block can be singulated by many techniques, including those described in U.S. patent application Ser. No. 11/546,683 filed on Oct. 11, 2006, entitled "Block Formation Process", which is incorporated by referenced. Integrated circuit blocks are next suspended in a fluid. The fluid is then dispersed over a substrate, such as a flexible substrate, to create separate tags. Receptor regions in the substrate would receive at least one integrated circuit, which then can be connected with an antenna on the substrate to form a tag. An example of fluidic self-assembly (FSA) is described in U.S. Pat. No. 6,864,570, entitled "Method for Fabricating Self-Assembling Microstructures," which is incorporated by reference herein.

Alternatively, other conventional or unconventional assembly methods may be used to construct the radio frequency tag. Silicon integrated circuits, formed using standard CMOS processes can be bonded to an antenna using robotic techniques (e.g., pick and place methods, surface mounted flip chips, and the like), vibratory assembly techniques, or a wire bonding construction. The chip can be placed in a carrier, such as a lead frame or a strap, or be bonded directly to an antenna. Strap attachment may be accomplished in automatic web processes using Alien Technology Corporation's high speed strap attach machine (HiSAM™ machine). The chip need not be made of silicon—devices built from semiconductors such as GaAs, or even organic semiconductors, can achieve the benefits derived from these communication methods.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A circuit to provide a power supply, comprising:
a first bias circuit to supply a gate to source bias, which is independent of a direct current (DC) output voltage;
a voltage multiplier circuit coupled to the first bias circuit, the voltage multiplier circuit having at least one n-channel metal-oxide-semiconductor (NMOS) transistor with the voltage multiplier circuit to generate the DC output voltage for powering a RF identification tag, the first bias circuit to receive a RF input source and generate the gate to source bias for a gate terminal of the NMOS transistor.

2. The circuit of claim 1 wherein the first bias circuit to generate the gate to source bias for the gate terminal of the NMOS transistor to DC bias the NMOS transistor substantially to a threshold voltage of the NMOS transistor and wherein the first bias circuit is coupled in series between the gate terminal of the NMOS transistor of the voltage multiplier circuit and a DC voltage input to the voltage multiplier circuit.

3. The circuit of claim 1, further comprising:
a second bias circuit to receive the RF input source and to generate a gate to source bias for a gate terminal of a p-channel metal-oxide-semiconductor (PMOS) transistor of the voltage multiplier circuit.

4. The circuit of claim 3 wherein the second bias circuit to generate the gate to source bias for the gate terminal of the PMOS transistor to DC bias the PMOS transistor substantially to a threshold voltage of the PMOS transistor.

5. The circuit of claim 2 wherein the first bias circuit comprises a NMOS transistor, a PMOS transistor, and at least one capacitor.

6. The circuit of claim 5 wherein a gate terminal of the NMOS transistor of the first bias circuit is coupled to a source terminal of the PMOS transistor of the first bias circuit and a gate terminal of the PMOS transistor is coupled to a source terminal of the NMOS transistor in order to lower threshold voltages of the NMOS and PMOS transistors.

7. The circuit of claim 1 wherein a second bias circuit to receive the RF input source and to generate a gate to source bias for a gate terminal of another NMOS transistor of the voltage multiplier circuit.

8. A multi-stage voltage multiplier circuit, comprising:
a first stage of the multi-stage voltage multiplier circuit comprising:
a first bias circuit having no effective load;
a first voltage multiplier circuit coupled to the first bias circuit, the first voltage multiplier circuit having at least one n-channel metal-oxide-semiconductor (NMOS) transistor with the first voltage multiplier circuit to generate a direct current (DC) output voltage, the first bias circuit to receive a RF input source and generate a gate to source bias for a gate terminal of the NMOS transistor of the first voltage multiplier circuit.

9. The multi-stage voltage multiplier circuit of claim 8 wherein the first stage further comprises a second bias circuit to receive the RF input source and generate a gate to source bias for a gate terminal of a p-channel metal-oxide-semiconductor (PMOS) transistor or another NMOS transistor of the first voltage multiplier circuit.

10. The voltage multiplier circuit of claim 8 wherein the first bias circuit comprises a NMOS transistor, a PMOS transistor, and at least one capacitor.

11. The voltage multiplier circuit of claim 8, further comprising:
a second stage of the multi-stage voltage multiplier circuit comprising:
a third bias circuit;
a second voltage multiplier circuit coupled to the third bias circuit, the second voltage multiplier circuit having at least one NMOS transistor with the second voltage multiplier circuit to receive the DC output voltage from the first stage and generate an increased DC output voltage, the third bias circuit to receive the RF input source and to generate a gate to source bias for a gate of a NMOS transistor of the second voltage multiplier circuit.

12. The multi-stage voltage multiplier circuit of claim 11 wherein the second voltage multiplier circuit further comprises at least one p-channel metal-semiconductor-oxide (PMOS) transistor with a gate terminal of one of the PMOS transistors of the second voltage multiplier circuit being coupled to ground.

13. A demodulator circuit, comprising:
a first bias circuit to supply a gate to source bias;
a first clamping transistor coupled to the first bias circuit; and
a voltage multiplier circuit coupled to the clamping transistor, the voltage multiplier circuit having at least one n-channel metal-oxide-semiconductor (NMOS) transistor with the voltage multiplier circuit to generate a demodulated output signal that demodulates information carried by a RF input signal, the first bias circuit to receive the RF input signal and generate the gate to source bias for a gate terminal of the NMOS transistor, the first clamping transistor to limit a value of the gate to source bias to approximately one threshold voltage of the first clamping transistor or less.

14. The demodulator of claim 13 wherein the first bias circuit to generate the gate to source bias for the gate terminal of the NMOS transistor to DC bias the NMOS transistor substantially to a threshold voltage of the NMOS transistor and wherein the first bias circuit is coupled in series between the gate of the NMOS transistor and a DC voltage input to the voltage multiplier circuit.

15. The demodulator of claim 13, further comprising:
a second bias circuit to receive the RF input source and generate a gate to source bias for a gate terminal of a p-channel metal-oxide-semiconductor (PMOS) transistor or another NMOS transistor of the voltage multiplier circuit; and
a second clamping transistor coupled to the second bias circuit, the second clamping transistor to limit a value of the gate to source bias to approximately one threshold voltage of the second clamping transistor or less.

16. The demodulator of claim 13, further comprising:
an isolation switch coupled to the first bias circuit, the isolation switch to regulate a voltage bias generated by the first bias circuit.

17. The demodulator of claim 14 wherein the first bias circuit comprises a NMOS transistor, a PMOS transistor, and at least one capacitor.

18. A circuit to provide a power supply, comprising:
a first bias circuit to supply a gate to source bias, which is independent of a direct current (DC) output voltage; and
a voltage multiplier circuit coupled to the first bias circuit, the voltage multiplier circuit having at least one p-channel metal-oxide-semiconductor (PMOS) transistor with the voltage multiplier circuit to generate the DC output voltage for powering a RF identification tag, the first bias circuit to receive a RF input source and generate the gate to source bias for a gate terminal of the PMOS transistor.

19. The circuit of claim 18 wherein the first bias circuit to generate the gate to source bias for the gate terminal of the PMOS transistor to DC bias the PMOS transistor substantially to a threshold voltage of the PMOS transistor and wherein the first bias circuit is coupled in series between the gate terminal of the PMOS transistor of the voltage multiplier circuit and a DC voltage input to the voltage multiplier circuit.

20. The circuit of claim 18, further comprising:
a second bias circuit to receive the RF input source and to generate a gate to source bias for a gate terminal of another PMOS transistor of the voltage multiplier circuit.

* * * * *